US012721171B2

(12) United States Patent
Kocer et al.

(10) Patent No.: US 12,721,171 B2
(45) Date of Patent: Aug. 25, 2026

(54) INTEGRATED CURCUIT TO DIELECTRIC SUBSTRATE TRANSITION

(71) Applicant: Analog Devices International Unlimited Company, Limerick (IE)

(72) Inventors: Fatih Kocer, Boxboro, MA (US); Christoph Maximilian Steinbrecher, Pennington, NJ (US); Sacid Oruc, Yenimahalle (TR); Ekrem Oran, Hollis, NH (US); Santosh Anil Kudtarkar, Ayer, MA (US); Arun Raj, Woburn, MA (US)

(73) Assignee: Analog Devices International Unlimited Company, Limerick (IE)

( * ) Notice: Subject to any disclaimer, the term of this patent is extended or adjusted under 35 U.S.C. 154(b) by 675 days.

(21) Appl. No.: 18/148,176

(22) Filed: Dec. 29, 2022

(65) Prior Publication Data

US 2024/0222294 A1 Jul. 4, 2024

(51) Int. Cl.

*H10W 42/00* (2026.01)
*H10W 70/60* (2026.01)
(Continued)

(52) U.S. Cl.

CPC .......... *H10W 42/00* (2026.01); *H10W 70/611* (2026.01); *H10W 70/65* (2026.01);
(Continued)

(58) Field of Classification Search

CPC ... H01L 23/585; H01L 23/06; H01L 23/5383; H01L 23/5386; H01L 23/66;
(Continued)

(56) References Cited

U.S. PATENT DOCUMENTS

| | | | |
|---|---|---|---|
| 6,060,959 | A | 5/2000 | Yakuwa |
| 6,967,543 | B2 | 11/2005 | Ammar |

(Continued)

FOREIGN PATENT DOCUMENTS

| | | | |
|---|---|---|---|
| CN | 205142145 | U | 4/2016 |
| EP | 1077502 | A2 | 2/2001 |

(Continued)

OTHER PUBLICATIONS

Villegas, Frank J, et al., "A Novel Waveguide-to-Microstrip Transition for Millimeter-Wave Module Applications", IEEE Transactions on Microwave Theory and Techniques, 47(1), (1999), 48-55.

(Continued)

*Primary Examiner* — Marlon T Fletcher
*Assistant Examiner* — Christina A Sylvia
(74) *Attorney, Agent, or Firm* — Schwegman Lundberg & Woessner, P.A.

(57) ABSTRACT

An electronic device package may include an integrated circuit die mounted on a package substrate, the package substrate may include a dielectric medium, the integrated circuit die may include respective electrical interconnects located between the integrated circuit die and the dielectric medium. The electronic device package may also include a first transmission line which may be embedded within the dielectric medium, the first transmission line may be fed by the integrated circuit die from at least one of the respective electrical interconnects and through a corresponding first via structure in the dielectric medium. The integrated circuit die may one or more of include or be attached to a conductive plane that extends to overlap with a location of the first via structure in the dielectric medium. The conductive plane may be connected to a first return structure of the first transmission line by one or more conductive pillars.

20 Claims, 14 Drawing Sheets

(51) Int. Cl.

| | |
|---|---|
| ***H10W 70/65*** | (2026.01) |
| ***H10W 70/685*** | (2026.01) |
| ***H10W 76/17*** | (2026.01) |
| *H10W 90/00* | (2026.01) |

(52) U.S. Cl.
CPC ......... *H10W 70/685* (2026.01); *H10W 76/17* (2026.01); *H10W 90/724* (2026.01)

(58) Field of Classification Search
CPC . H01L 23/3128; H01L 23/4812; H01L 24/16; H01L 2224/16225; H01L 25/0655; H01L 2223/6616; H01L 2223/6627; H01L 2223/6655; H01L 2223/6677; H03F 2200/451
See application file for complete search history.

(56) References Cited

U.S. PATENT DOCUMENTS

| | | | | |
|---|---|---|---|---|
| 7,405,477 | B1 | 7/2008 | Tao et al. | |
| 11,251,513 | B2 | 2/2022 | Rogers | |
| 11,824,019 | B2 * | 11/2023 | Erdoel | H01Q 1/2283 |
| 12,087,990 | B2 * | 9/2024 | Gunnarsson | H05K 1/144 |
| 2004/0140863 | A1 | 7/2004 | Ammar | |
| 2009/0207080 | A1 | 8/2009 | Floyd et al. | |
| 2011/0140777 | A1 | 6/2011 | Drogi et al. | |
| 2012/0256707 | A1 * | 10/2012 | Leiba | H01P 3/121 216/13 |
| 2014/0125425 | A1 | 5/2014 | Shen et al. | |
| 2014/0176253 | A1 | 6/2014 | Niman et al. | |
| 2014/0320231 | A1 | 10/2014 | Seler et al. | |
| 2015/0364830 | A1 | 12/2015 | Tong et al. | |
| 2020/0280121 | A1 * | 9/2020 | Dogiamis | H01L 24/81 |
| 2023/0064473 | A1 | 3/2023 | Cahill et al. | |
| 2024/0186594 | A1 | 6/2024 | Broeckelmann | |
| 2024/0222871 | A1 | 7/2024 | Kocer et al. | |
| 2024/0275061 | A1 | 8/2024 | Hsu et al. | |
| 2024/0322775 | A1 | 9/2024 | Kamgaing et al. | |
| 2025/0149457 | A1 | 5/2025 | Ho et al. | |

FOREIGN PATENT DOCUMENTS

| | | | |
|---|---|---|---|
| EP | 2843758 | A1 | 3/2015 |
| EP | 2860756 | A1 | 4/2015 |
| EP | 3151276 | A1 | 4/2017 |

OTHER PUBLICATIONS

"U.S. Appl. No. 18/148,201, Final Office Action mailed Oct. 8, 2025", 33 pgs.
"U.S. Appl. No. 18/148,201, Response filed Aug. 27, 2025 to Non Final Office Action mailed May 27, 2025", 11 pgs.
"U.S. Appl. No. 18/148,201, Response filed Nov. 24, 2025 to Final Office Action mailed Oct. 8, 2025", 13 pgs.
"U.S. Appl. No. 18/148,201, Advisory Action mailed Dec. 4, 2025", 3 pgs.
"U.S. Appl. No. 18/148,201, Non Final Office Action mailed Feb. 13, 2026", 14 pgs.
"U.S. Appl. No. 18/148,201, Non Final Office Action mailed May 27, 2025", 21 pgs.
"European Application Serial No. 23214777.7, Extended European Search Report mailed May 6, 2024", 11 pgs.
"European Application Serial No. 23214777.7, Response filed Sep. 12, 2024 to Extended European Search Report mailed May 6, 2024", 28 pgs.
"European Application Serial No. 23214778.5, Extended European Search Report mailed Aug. 23, 2024", 18 pgs.
"European Application Serial No. 23214778.5, Partial European Search Report mailed May 3, 2024", 22 pgs.
"European Application Serial No. 23214778.5, Response filed Feb. 14, 2025 to Extended European Search Report mailed Aug. 23, 2024", 36 pgs.
Weimann, Nils G., et al., "Manufacturable Low-Cost Flip-Chip Mounting Technology for 300-500-GHz Assemblies", IEEE Transactions On Components, Packaging And Manufacturing Technology, IEEE, USA, vol. 7, No. 4, (Apr. 1, 2017), 494-501.

* cited by examiner

1400

1402

DRIVING A FIRST ANTENNA AND A SECOND ANTENNA USING A FIRST POWER AMPLIFIER AND A SECOND POWER AMPLIFIER RESPECTIVELY, WHEREIN THE FIRST ANTENNA AND THE SECOND ANTENNA ARE POSITIONED TO EXCITE A TRANSITION CAVITY, THE TRANSITION CAVITY DEFINED BY A DIELECTRIC MEDIUM, THE TRANSITION CAVITY SIZED AND SHAPED FOR MECHANICAL COUPLING WITH A WAVEGUIDE STRUCTURE

1404

RECEIVING, FROM AN ELECTROMAGNETIC PROBE ELECTRICALLY COUPLED WITH THE TRANSITION CAVITY, A SIGNAL REPRESENTATIVE OF AN ELECTROMAGNETIC FIELD IN THE TRANSITION CAVITY

1406

ADJUSTING, BASED AT LEAST IN PART UPON THE RECEIVED SIGNAL FROM THE ELECTROMAGNETIC PROBE, AT LEAST ONE OF THE FIRST POWER AMPLIFIER OR THE SECOND POWER AMPLIFIER

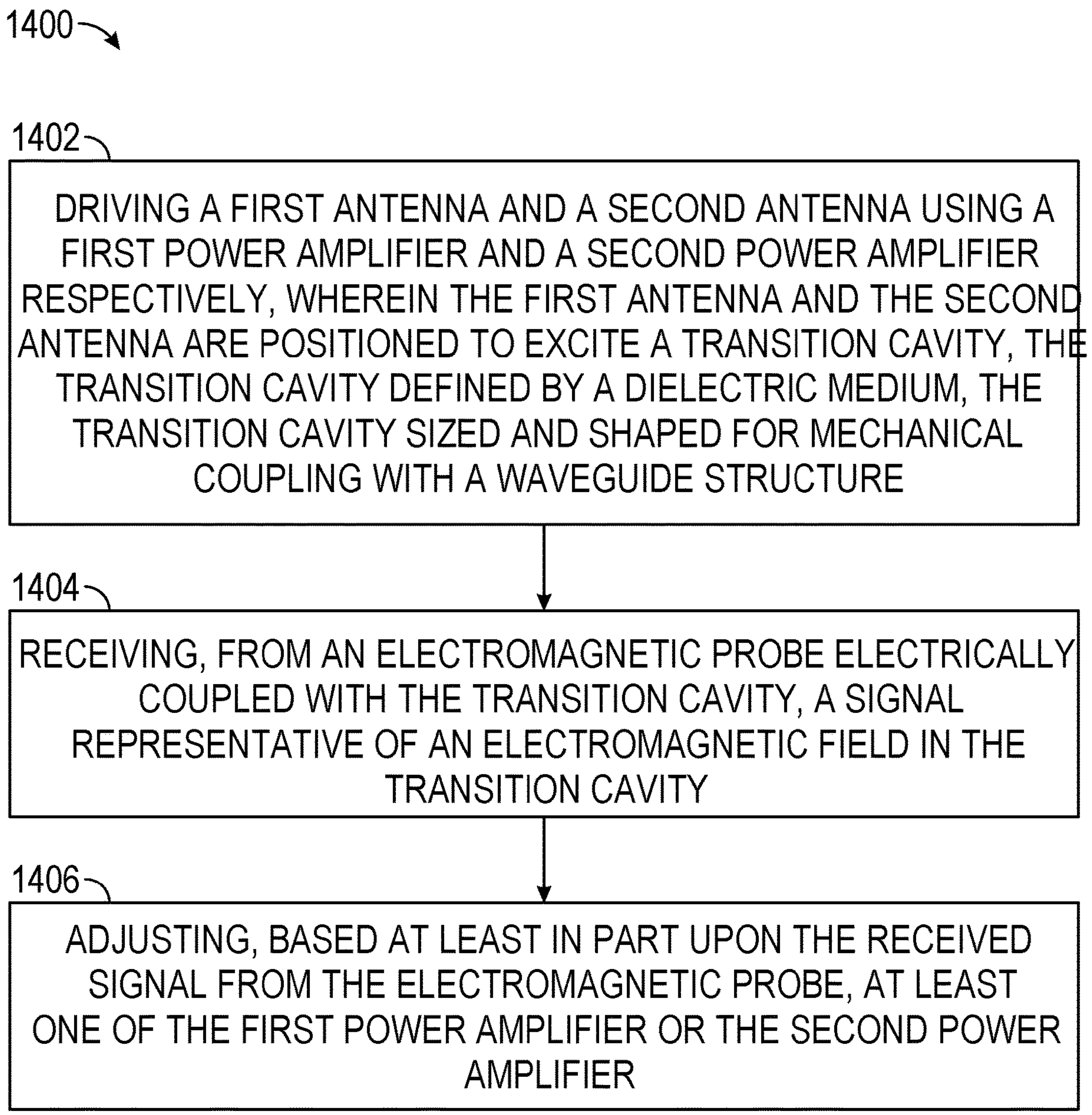

FIG. 14

INTEGRATED CURCUIT TO DIELECTRIC SUBSTRATE TRANSITION

TECHNOLOGICAL FIELD

The present disclosure relates to electronics, and more particularly, but not by way of limitation, to an electronic device package for providing power to a waveguide.

BACKGROUND

Modern systems can use transmission lines, antennas, and waveguides for transmitting and receiving signals. Examples of such modern systems include communication systems, radar systems, and radio frequency circuits such as radio frequency analyzers and radio frequency converters.

SUMMARY

Radio frequency systems, such as transmitters and receivers, may include integrated circuits, transmission lines, antennas, and waveguides. In a radio frequency system, it may be helpful to one or more of increase efficiency, reduce noise in signals, or reduce power consumption. A radio frequency transmitter may include an integrated circuit for generating the signal to be transmitted, a power amplifier for amplifying the signal, a transmission line for transmitting the amplified signal to an antenna, and an antenna for sending the signal. The signal may be transmitted into a waveguide or into another medium, such as may include open air or free space.

A multi-channel amplifier may be used to increase one or more of a power or efficiency level of the transmitter. In an approach, the channels of the amplifier may be combined using transmission line combiners before being sent to a single antenna. The present inventors have recognized, among other things, that it may be desirable to have one or more power amplifiers feeding two or more antennas. The channels of the one or more power amplifiers may be combined using transmission line structures or other power combiners, and such combination of the signals may take place in part using spatial summation of electromagnetic fields generated by antennas. Use of spatial combination may enable simplification of a circuit or module configuration, such as allowing a smaller footprint or otherwise enhancing performance. For example, such a spatial combination approach may help with one or more of efficiency, signal clarity (e.g., linearity, matching, cross-talk, or loss, or combinations thereof), or can provide reduced cost. The present inventors have recognized, among other things, that placing a conductive cap adjacent to one or more antennas in a transition cavity structure may help efficiently couple an electromagnetic wave into (or out of) a waveguide.

The electromagnetic field generated by the two or more antennas in the transition cavity structure may be monitored by an electromagnetic probe, such as may measure an amplitude or phase of the electromagnetic field generated by the two or more antennas. Feedback from the electromagnetic probe may be used to adjust the signal transmitted by one or more of the antennas.

In an approach, discrete integrated circuit dice or packages may be placed on a dielectric substrate. The dielectric substrate may include one or more layers of dielectric material and conductive regions. The integrated circuits may be placed on the substrate and electrically connected to the substrate using wire bonds. The wire bonds may have an undesirable level of one or more of parasitic capacitance or mutual inductance. The present inventors have recognized, among other things, that it may be desirable to locate the integrated circuits, such as may include an integrated circuit die, in a flip-chip orientation which may use solder bumps or conductive pillars to directly connect to the substrate. The transmitter may be formed into one package, such as by overmolding the integrated circuits and substrate.

To help reduce coupling between electrical connections joining the integrated circuit to the substrate, such as may be due to electromagnetic coupling (e.g. mutual inductance), a ground plane of the integrated circuit may be extended to cover a portion of the substrate. Electrically conductive pillars may be placed surrounding one or more connections, such as may provide further shielding or isolation between adjacent channels defined by the connections.

In an example an electronic device package may include a substrate which may include a dielectric medium. A transition cavity may be defined by the dielectric medium, the transition cavity may be sized and shaped for mechanical coupling with a waveguide structure. The electronic device package may also include a first antenna and a second antenna, the first antenna and the second antenna may be positioned to excite the transition cavity, the first antenna may be fed by a first transmission line and the second antenna may be fed by a second transmission line. The electronic device package may also include an electromagnetic probe which may be electrically coupled with the transition cavity. The electromagnetic probe may interact with an electromagnetic field in the transition cavity and may provide an electrical signal representative of the electromagnetic field in the transition cavity. The first transmission line may include a first planar conductor and the second transmission line may include a second planar conductor, the first planar conductor and the second planar conductor may be supported by at least one dielectric layer defining the dielectric medium.

In an example, a method of operating an electronic device package may include driving a first antenna and a second antenna using a first power amplifier and a second power amplifier respectively, where the first antenna and the second antenna are positioned to excite a transition cavity, the transition cavity defined by a dielectric medium, the transition cavity sized and shaped for mechanical coupling with a waveguide structure. Receiving, from an electromagnetic probe electrically coupled with the transition cavity, a signal representative of an electromagnetic field in the transition cavity. Adjusting, based at least in part upon the received signal from the electromagnetic probe, at least one of the first power amplifier or the second power amplifier.

In an example an electronic device package may include a substrate which may include a dielectric medium. A transition cavity may be defined by the dielectric medium, the transition cavity may be sized and shaped for mechanical coupling with a waveguide structure. The electronic device package may also include a first antenna and a second antenna, the first antenna and the second antenna may be positioned to excite the transition cavity, the first antenna may be fed by a first transmission line and the second antenna may be fed by a second transmission line. The electronic device package may also include an electromagnetic probe which may be electrically coupled with the transition cavity. The electromagnetic probe may interact with an electromagnetic field in the transition cavity and may provide an electrical signal representative of the electromagnetic field in the transition cavity. The electronic device package may also include a conductive cap located on a surface of the dielectric medium overlapping with the transition cavity opposite a surface of the dielectric medium defining an output of the transition cavity used for mechanical coupling with a waveguide structure.

In an example an electronic device package may include an integrated circuit die mounted on a package substrate, the package substrate may include a dielectric medium, the integrated circuit die may include respective electrical interconnects located between the integrated circuit die and the dielectric medium. The electronic device package may also include a first transmission line which may be embedded within the dielectric medium, the first transmission line may be fed by the integrated circuit die from at least one of the respective electrical interconnects and through a corresponding first via structure in the dielectric medium. The electronic device package may also include a waveguide transition cavity which may be defined by the dielectric medium, the waveguide transition cavity may be excited by a first antenna fed by the first transmission line. The electronic device package may also include a conductive cap located on a surface of the dielectric medium overlapping with the waveguide transition cavity opposite a surface of the dielectric medium defining an output of the waveguide transition cavity which may be used for mechanical coupling with a waveguide structure.

In an example an electronic device package may include an integrated circuit die mounted on a package substrate, the package substrate may include a dielectric medium, the integrated circuit die may include respective electrical interconnects located between the integrated circuit die and the dielectric medium. The electronic device package may also include a first transmission line which may be embedded within the dielectric medium, the first transmission line may be fed by the integrated circuit die from at least one of the respective electrical interconnects and through a corresponding first via structure in the dielectric medium. The integrated circuit die may one or more of include or be attached to a conductive plane that extends to overlap with a location of the first via structure in the dielectric medium. The conductive plane may be connected to a first return structure of the first transmission line by one or more conductive pillars.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example, but not by way of limitation.

FIG. 14 is a flow chart showing an example of a method of operating an electronic device package.

DETAILED DESCRIPTION

This document describes, among other things, an electronic device package that uses transmission line combiners and spatial power combination using electromagnetic fields.

Figure 1:
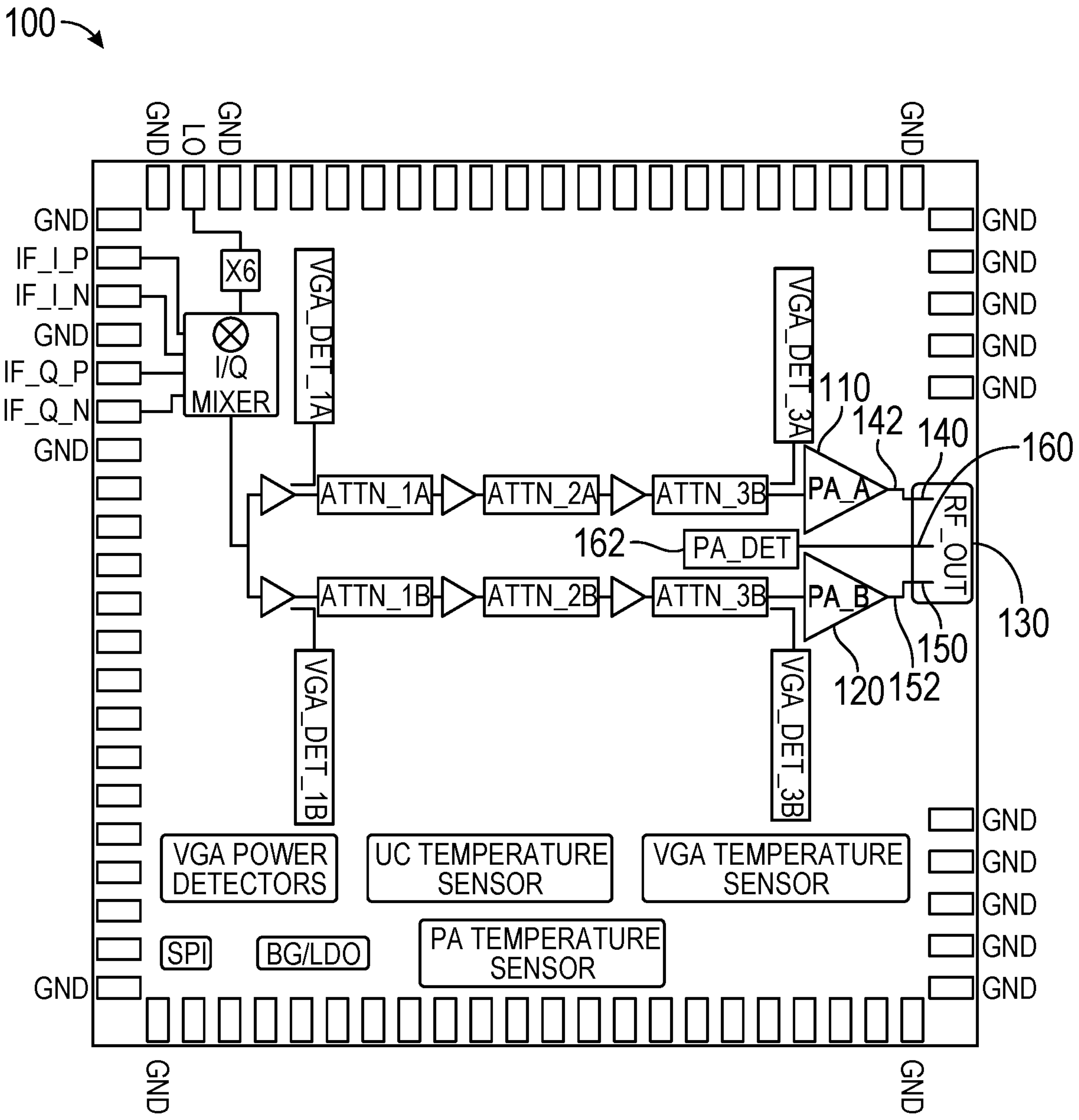
FIG. 1 is a block diagram of an example of portions of an electronic device package.

FIG. 1 is a block diagram of an example of portions of an electronic device package 100. The electronic device package 100 may be used in a device, such as may include a radio-frequency transmitter or receiver. In the example of FIG. 1, the electronic device package 100 may include a first power amplifier 110, a second power amplifier 120, and a transition cavity 130. The transition cavity 130 may include a first antenna 140, a second antenna 150, and an electromagnetic probe 160. The first antenna 140 may be connected to the first power amplifier 110 by the first transmission line 142. The second antenna 150 may be connected to the second power amplifier 120 by the second transmission line 152.

The first power amplifier 110 may be a transistor-based power amplifier, such as may include one or more of a field effect transistor (FET) or bipolar junction transistor (BJT). The first power amplifier 110 may amplify a signal, such as by increasing one or more of a current, voltage, or power of a signal. The first power amplifier 110 may amplify a signal for transmission, or may amplify a received signal before further processing. The first power amplifier 110 may have one or more parallel channels.

The second power amplifier 120 may be constructed similarly to the first power amplifier 110 or may differ in one or more ways. The first power amplifier 110 and the second power amplifier 120 may operate in parallel amplifying the same signals, or may amplify different signals. In an example, the first power amplifier 110 and the second power amplifier 120 may amplify the same signal, but the signal provided to one of the power amplifiers may be phase shifted, such as may include a phase shift of 30 degrees, 45 degrees, 60 degrees, 90 degrees, 180 degrees, or 270 degrees, as illustrative examples.

The first transmission line 142 may be any type of transmission line, such as a planar transmission line (e.g., a transmission line structure comprising a planar conductor). A planar transmission line may include one or more of microstrip transmission line, a stripline transmission line, or a coplanar waveguide structure (e.g., a structure not strictly limited to a transverse electromagnetic (TEM) mode). A microstrip transmission line may include a thin flat conductor over a return plane. A stripline transmission line may include a thin flat conductor sandwiched between two parallel return planes. In a planar transmission line, a dielectric may be used to electrically isolate the conductors from reference or return planes. A dielectric may have insulating properties, such as may include a larger breakdown voltage than air at standard atmospheric conditions. A dielectric may polarize in response to an electric field, which may affect the properties of electromagnetic waves in the dielectric. A dielectric may include a polymer, a glass, a ceramic, or combinations thereof. A dielectric may respond differently to different frequencies of electromagnetic waves, which may result in different loss characteristics versus frequency or other variations in electrical characteristics versus frequency, such as group velocity variation versus frequency. Variation in group delay can be referred to as dispersion, or the dielectric being dispersive. In an example, the dielectric may be non-dispersive, substantially non-dispersive, or otherwise have specified characteristics across a specified frequency range.

The first transmission line 142 may conduct an electromagnetic wave along the path of the first transmission line 142. The first transmission line 142 may be configured to conduct electromagnetic waves having a specified frequency, or a specified range of frequencies. In an example, the electronic device package 100, including the first transmission line 142 and the first transmission line the second transmission line 152 may be constructed to operate within the "E" band of radio frequencies, such as may include 71 gigahertz to 86 gigahertz. Such a frequency range is illustrative, and other frequency ranges may be used. The second transmission line 152 may be constructed similarly to the first transmission line 142 or may differ in one or more ways.

The transition cavity 130 may be defined by a dielectric medium. The transition cavity 130 may be one or more of sized or shaped for one or more of mechanical or electromagnetic coupling with a waveguide, such as may include a WR12 waveguide. The transition cavity 130 may have approximately the same cross-section as a waveguide. In an example, one or more dimensions of the transition cavity 130 may be determined according to three-dimensional electromagnetic simulations, such as may be configured to achieve one or more of a desired input matching or bandwidth. In an example, the transition cavity 130 may have one or more of a length of width that is approximately an integer multiple of a half wavelength of a desired operating frequency, such as may include one-half wavelength, one wavelength, one and a half wavelengths, two wavelengths, two and a half wavelengths, or three wavelengths. In an example, a waveguide, such as may include a WR12 waveguide, may be attached to the electronic device package 100 for routing a signal amplified by the first power amplifier 110 and the second power amplifier 120 to a transmission antenna.

The first antenna 140 may be any type of antenna, such as may include a half-wavelength dipole or a half-wavelength monopole. The first antenna 140 may be a planar antenna, and may be largely confined to a single plane having a specified thickness. The first antenna 140 may protrude into the transition cavity 130 and may be configured to excite the transition cavity. The second antenna 150 may be constructed similarly to the 140 or may differ in one or more ways.

The electromagnetic probe 160 may protrude into the transition cavity 130 and may be configured to interact with an electromagnetic field in the transition cavity 130 and provide an electrical signal representative of the electromagnetic field in the transition cavity 130. The electromagnetic probe 160 may be electrically coupled with the transition cavity 130. The electromagnetic probe 160 may be a conductive probe that interacts with an electric field in the transition cavity 130 and may produce an electrical signal with a magnitude proportional to a strength of the electric field in the transition cavity 130. The electromagnetic probe 160 may be electrically connected to an electromagnetic signal processor 162. The electromagnetic signal processor 162 may process a signal from the electromagnetic probe 160 to determine one or more of a magnitude of an electric field, an amplitude of an electric field, an amplitude of an electromagnetic field, a frequency of an electromagnetic field, or a phase of an electromagnetic field.

The electromagnetic signal processor 162 may be configured to adjust one or more of the first power amplifier 110 or the second power amplifier 120 in response to the signal received from the electromagnetic probe 160. The electromagnetic signal processor 162 may be configured to adjust a component feeding one or more of the first power amplifier 110 or the second power amplifier 120. The adjustment may include one or more of tuning or adjusting a power (e.g., a gain), a phase, or a frequency of a respective amplifier.

Figure 2:
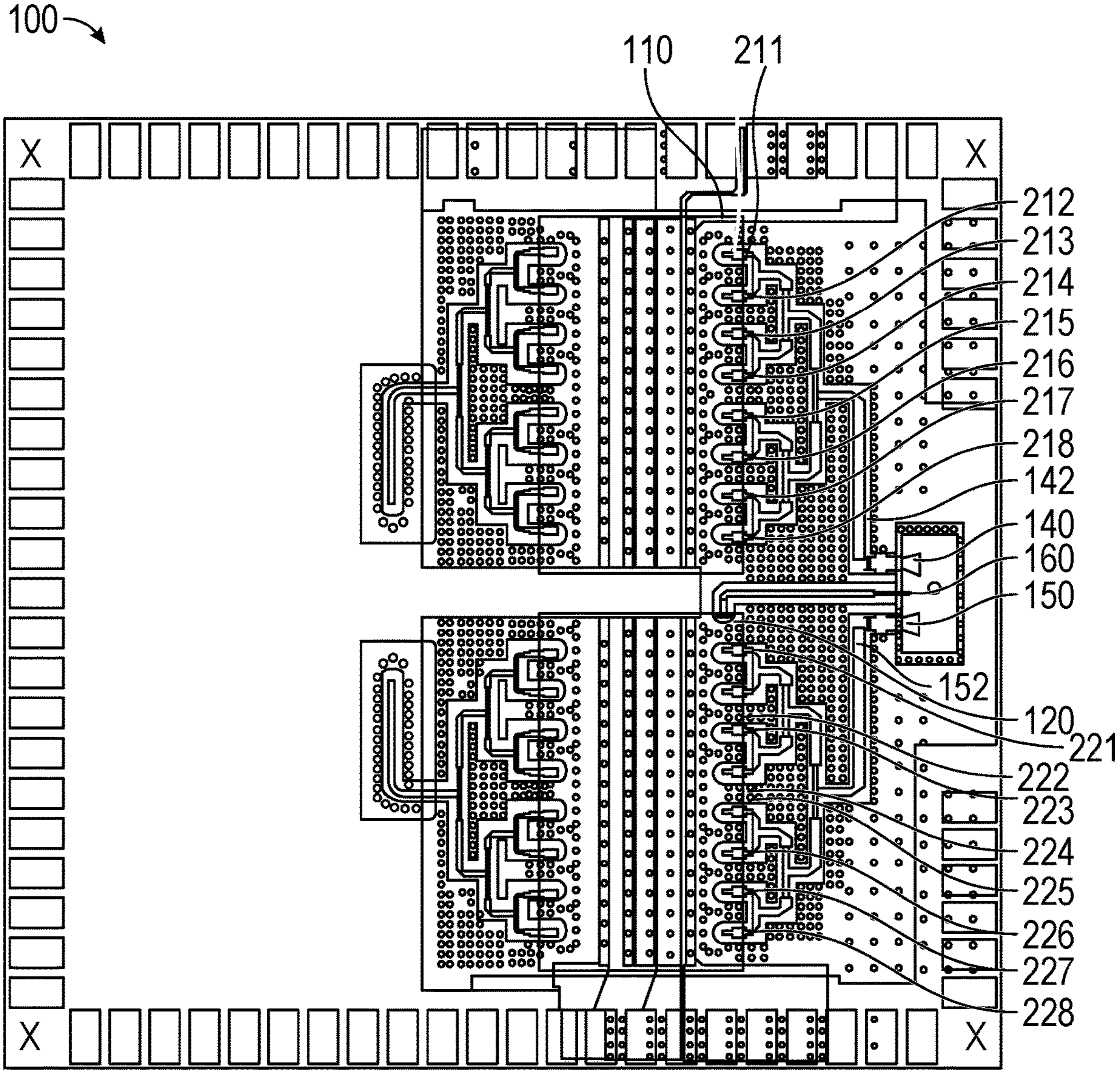
FIG. 2 illustrates generally a physical layout of portions of an electronic device package.

FIG. 2 is a circuit drawing of an example of portions of an electronic device package 100. In the example of FIG. 2, the first power amplifier 110 may include a first channel 211, a second channel 212, a third channel 213, a fourth channel 214, a fifth channel 215, a sixth channel 216, a seventh channel 217, and an eighth channel 218. The second power amplifier 120 may include a first channel 221, a second channel 222, a third channel 223, a fourth channel 224, a fifth channel 225, a sixth channel 226, a seventh channel 227, and an eighth channel 228.

The channels 211-218 or the first power amplifier 110 may all be similarly constructed or may differ in one or more ways. One or more of the channels 211-218 may include multiple stages, such as may include one or more transistor amplifiers in series. Each of the channels 211-218 may be fed by a common incoming feed which may be divided to feed the channels individually. The branches may be configured to be similar to each other or substantially identical in electrical length such that the phase of the signal entering each of the channels 211-218 is similar or substantially identical. Each of the channels 211-218 may be coupled to an output port of the first power amplifier 110.

The channels 221-228 or the second power amplifier 120 may all be similarly constructed or may differ in one or more ways. One or more of the channels 221-228 may include multiple stages, such as may include one or more transistor amplifiers in series. Each of the channels 221-228 may be fed by a common incoming feed which may be divided to feed the channels individually. The branches may be configured to be similar or substantially identical in electrical length such that the phase of the signal entering each of the channels 221-228 is similar or substantially identical. Each of the channels 221-228 may be coupled to an output port of the second power amplifier 120. In an example, one or more of the first power amplifier 110 or the second power amplifier 120 may include one or more additional channels, and the example of eight channels as shown herein is merely illustrative.

The first antenna 140 and the second antenna 150 may be configured such that the electromagnetic signal from the first antenna 140 constructively sums with the electromagnetic signal from the second antenna 150. In an example, a phase of an output from the first antenna 140 may be selected to have a specific relationship with respect to a phase of an output from the second antenna 150 to establish a constructive spatial summation of the fields established by the first antenna 140 and the second antenna 150 in the transition cavity 130. The first antenna 140 and the second antenna 150 may be positioned or arranged on one side of the transition cavity 130. The first antenna 140 and the second antenna 150 may be spaced by a specified distance. In an example, the spacing of the antennas may be determined according to three-dimensional electromagnetic simulations, such as may be configured to achieve one or more of a desired input matching or bandwidth. In an example, the spacing may include a fraction of a wavelength, one-half wavelength, one wavelength, or one and one-half wavelengths. In an example, the first antenna 140 and the 150 may be positioned on different sides of the transition cavity 130. In an example, the first antenna 140 and the second antenna 150 may produce an equal power. In an example, the total power exiting the transition cavity 130 may be equal to approximately the sum of the power of the first antenna 140 and the second antenna 150.

In an example, there may be more than two antennas, and the example of two antennas as shown herein is merely illustrative. For example, the one or more additional antennas may be placed on any side of the transition cavity 130, and may be positioned such that an electromagnetic signal from the antenna constructively sums with the surrounding antennas. The one or more additional antennas may be fed by one or more of the first power amplifier 110, the second power amplifier 120, or by one or more additional power amplifiers.

In an example, the channels 211-218 or the first power amplifier 110 and the channels 221-228 or the second power amplifier 120 may be able to function independently, such as may include one at a time. A single channel may be turned on, and a strength of an electromagnetic field may be measured with the electromagnetic signal processor 162. In this way, individual channels of the first power amplifier 110 and the second power amplifier 120 may be one or more of measured, adjusted or tuned independently of other channels.

In an example, there may be one or more additional electromagnetic probes. The one or more additional electromagnetic probes may be positioned on any side of the transition cavity 130. The one or more additional electromagnetic probes may be connected to one or more additional electromagnetic signal processors. The one or more of the additional electromagnetic probes may be connected to the electromagnetic signal processor 162. The additional electromagnetic probes may be used to adjust one or more of the first power amplifier 110, the second power amplifier 120, or another power amplifier.

Figure 3A:
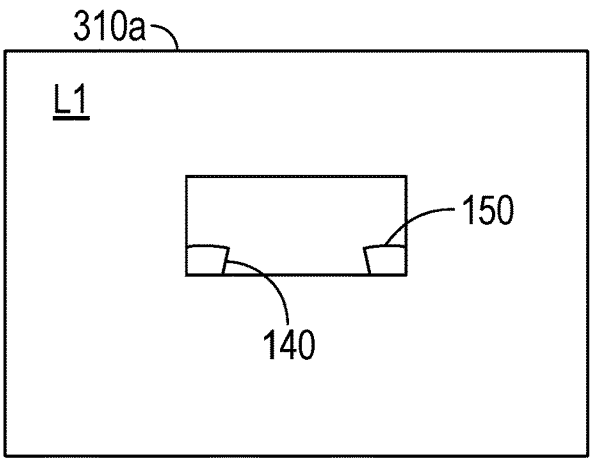
FIG. 3A, FIG. 3B, and FIG. 3C are views of an example of portions of a substrate showing a first layer (FIG. 3A), a third layer (FIG. 3B), and a fifth layer (FIG. 3C).
Figure 3B:
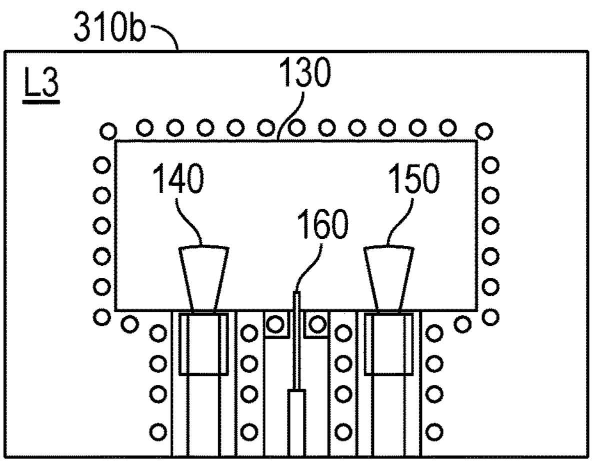
Figure 3C:
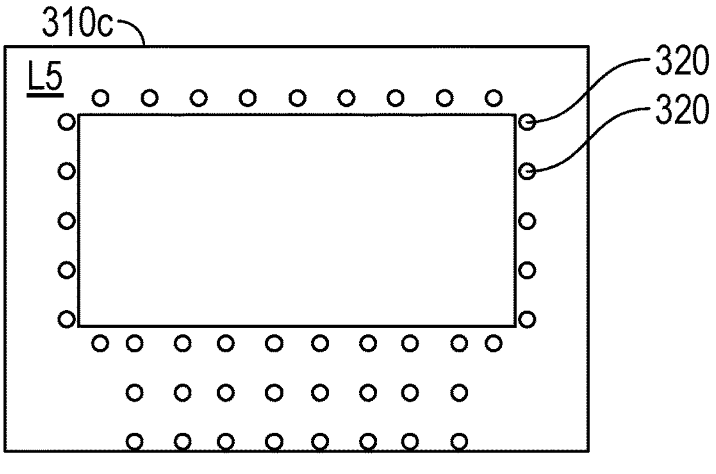

FIG. 3A, FIG. 3B, and FIG. 3C show an example of portions of a substrate for a first layer 310*a* (FIG. 3A), a third layer 310*b* (FIG. 3B), and a fifth layer 310*c* (FIG. 3C) of a multi-layer structure, according to an illustrative example. A substrate used in an electronic device package, such as may include a layered dielectric substrate, may be constructed by alternating layers of a conductive material (e.g. copper) with layers of a nonconductive material (e.g. a dielectric). The layers of copper may be solid, such as may include an entire copper plane. The layers of copper may not be solid, such as may include one or more nonconductive regions, such as may be defined or established by one or more of etching, machining, or drilling. The non-conductive layers may insulate the conductive layers from one another, such as may include electrically isolating the layers. A connection may be formed between conductive layers, such as by drilling a hole through the nonconductive layer and filling or plating the hole with a conductive material (e.g. copper) to electrically connect the conductive layers, such as may result in a conductive pillar such as may include a filled via 320.

In the example of FIG. 3A, the first layer 310*a*, such as may be one or more of the top layer or the layer closest to the integrated circuit die, may define a generally rectangular region above the transition cavity 130 where conductive material is removed or absent. The first layer 310*a* may otherwise be generally solid and may be conductive across the entire first layer 310*a*.

The third layer 310*b*, such as may be a middle layer of the dielectric substrate, may define a generally rectangular region defining a portion of the transition cavity 130 where conductive material is removed or absent. The third layer 310*b* may include electrically isolated portions that include a portion of the first antenna 140, the second antenna 150, and the electromagnetic probe 160. The third layer 310*b* may otherwise be generally solid and may be conductive across the entire third layer 310*b*.

The fifth layer 310*c*, such as may include one or more of a bottom layer or a layer farther from the integrated circuit die than the first layer 310*a* or the third layer 310*b*, may define a generally rectangular region defining a portion of the transition cavity 130 where conductive material is removed or absent. The fifth layer 310*c* may otherwise be generally solid and may be conductive across the entire fifth layer 310*c*. The generally rectangular region in the fifth layer 310*c* may be one or more of sized or shaped for one or more of mechanical or electromagnetic coupling with a waveguide structure. In an example, a waveguide structure with a similarly sized input aperture may be coupled such that the waveguide is excited by an electromagnetic wave coupled through the region in the fifth layer 310*c*.

The perimeters of one or more of the first layer 310*a*, third layer 310*b*, fifth layer 310*c*, and any other layers in the substrate may include a number of via structures such as the vias 320, such as may form a dielectric-filled transition cavity 130 walled laterally by the via structures. The electrically connected portions of the layers, such as may be connected by the via structures, may be held at a reference potential, such as a ground potential. The transition cavity 130 may be able to be excited by the first antenna 140 and the second antenna 150, such as may include generating an electromagnetic wave to excite the waveguide structure.

The transition cavity 130 may not be completely conductive, such as may be due to gaps between vias 320. The pitch between the filled vias 320 may be sized such that electromagnetic energy within the cavity structure does not outcouple laterally. In this sense, the lateral sidewalls of the transition cavity 130 may behave electrically as if uniformly conductive at a specified frequency of electromagnetic radiation, such as may be due to nonconductive gaps being small compared to the wavelength of the electromagnetic energy in the cavity.

The substrate may be constructed one layer at a time, such as may include (1) establishing a first conductive layer with a specified form, (2) establishing a dielectric layer, (3) establishing a second conductive layer with a specified form, (4) establishing one or more vias through the dielectric layer and one or more of the conductive layers, if desired, (5) filling or plating one or more vias, if desired, with a conductive material to electrically connect at least a portion of the first conductive layer to at least a portion of the second conductive layer. These steps may be repeated to generate a substrate with a desired number of layers. In an example, two or more dielectric layers may be established between conductive layers. In an example, two or more conductive layers separated by dielectric layers may be established before forming and filling vias. In an example, the substrate may be constructed similarly to a printed circuit board (PCB).

A portion of one or more of the conductive layers may include rolled copper. Rolled copper may be used for at least a portion of one or more of the first antenna 140 or the second antenna 150. Rolled copper may be used for at least a portion of one or more of the first transmission line 142 or the second transmission line 152. Rolled copper may have a surface flatness that is smoother than some other forms of copper. A high level of surface flatness may enhance the electrical characteristics of transmission line structures, such as reducing loss as compared to other surface morphologies. In an example, rolled copper may perform better at high frequencies (e.g. above 60 GHZ) than one or more other forms of copper or other conductive materials.

Figure 4:
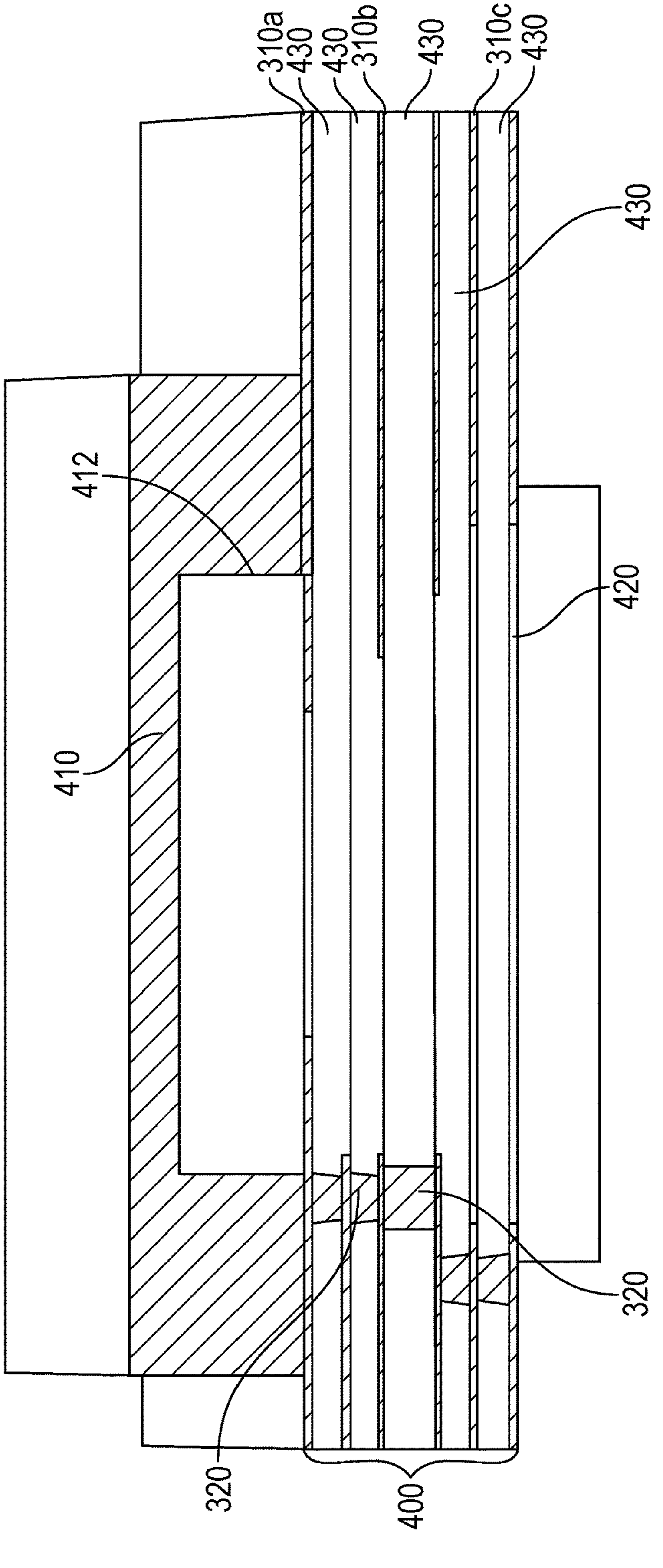
FIG. 4 is a cross-sectional view of an example of a portion of a substrate.

FIG. 4 is a cross-sectional view of an example of a portion of a substrate 400. The substrate 400 may include the first layer 310*a*, the third layer 310*b*, the fifth layer 310*c*, and one or more dielectric layers 430. A conductive cap 410 may be located on the substrate 400. The conductive cap 410 may be constructed of a conductive material (e.g. copper) and may define a conductive cap cavity 412 having an enclosed volume. The conductive cap 410 may be one or more of positioned or located on a surface of the substrate 400. The conductive cap 410 may be positioned on the first layer 310*a*, and may be electrically connected to the first layer 310*a* in one or more locations. The conductive cap 410 may be located on the first layer 310*a* overlapping with the transition cavity 130 opposite the waveguide interface 420.

The interior volume formed by the conductive cap cavity 412 may be positioned next to a portion of the transition cavity 130. The rectangular region in the first layer 310*a* may allow electromagnetic waves to enter the conductive cap cavity 412, such as may include resonating in the conductive cap cavity 412. The conductive cap cavity 412 may affect the properties of the transition cavity 130, such as may include adjusting a desired characteristic of the transition cavity 130. In an example the conductive cap cavity 412 may form a portion of the transition cavity 130. The conductive cap cavity 412 may be filled with one or more of a dielectric material, a vacuum, a gas, or air. In an example, the conductive cap 410 may be a planar cap with no conductive cap cavity 412. The conductive cap cavity 412 may increase the size of the transition cavity 130, which may help in efficiently exciting a waveguide.

The transition cavity 130 may be partially or completely filled with one or more of a dielectric or air. One or more of the first antenna 140, the second antenna 150, or the electromagnetic probe 160 on the third layer 310*b* may be buried between dielectric layers 430. The dielectric layers 430 may provide one or more of structural support or cooling to the one or more of the first antenna 140, the second antenna 150, or the electromagnetic probe 160.

A waveguide interface 420 for one or more of mechanical or electromagnetic coupling to a waveguide structure may be positioned on an opposite side of the substrate 400 from the conductive cap 410. The conductive cap 410 may help in directing waves from the transition cavity 130 towards the waveguide interface 420.

Figure 5:
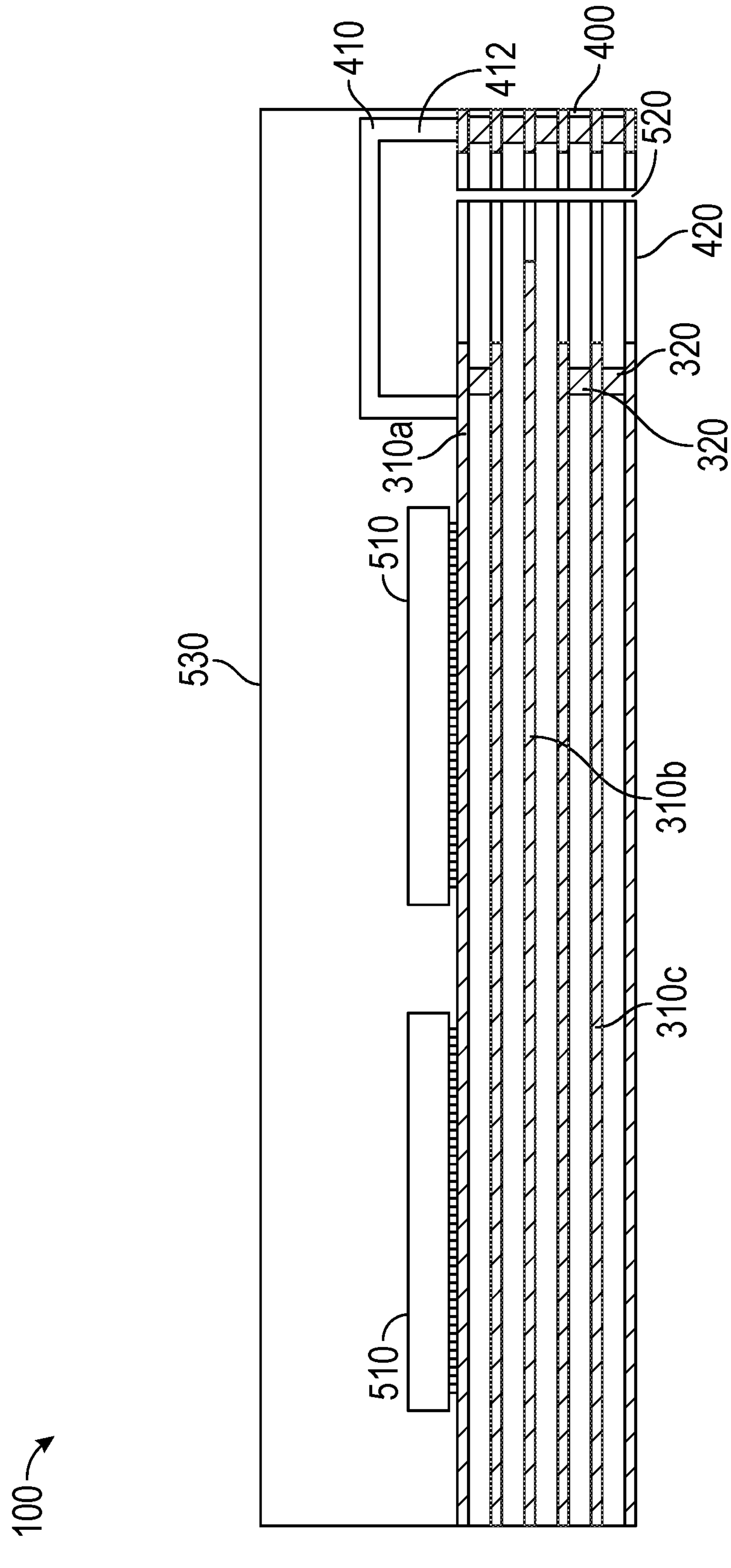
FIG. 5 is a cross-sectional view of an example of a portion of an electronic device package.

FIG. 5 is a cross-sectional view of an example of a portion of an electronic device package 100. In the example of FIG. 5, the electronic device package 100 may include one or more integrated circuit dice 510, a substrate 400, a conductive cap 410, and overmolding 530. The one or more integrated circuit dice 510 may be positioned or mounted on the substrate 400. The one or more integrated circuit dice 510 may be electrically coupled to the substrate 400 in one or more locations, such as may allow the one or more integrated circuit dice 510 to one or more of feed the first transmission line 142 and second transmission line 152 or communicate with each other. The first transmission line 142 and the second transmission line 152 may be embedded within the substrate 400.

The one or more integrated circuit dice 510 may be placed in a flip-chip orientation, such as may include a configuration where respective electrical interconnects on the substrate 400 are aligned with input or output pads on the one or more integrated circuit dice 510. The input or output pads on the one or more integrated circuit dice 510 may include solder bumps. The electrical interconnects on the substrate 400 may include one or more of bumps or pillars. The flip-chip orientation may allow elimination of the use of bond wires to connect the one or more integrated circuit dice 510 with other portions of the electronic device package 100. Bond wires may complicate the fabrication or package encapsulation process and from an electrical perspective, bond wires may create undesired parasitic effects, or may facilitate cross-talk with other conductors, which may decrease the performance of the electronic device package 100. A flip-chip orientation allows shorter interconnects between the one or more integrated circuit dice 510 and conductors on or within the substrate 400. Accordingly, use of a flip-chip orientation may remove one or more undesirable effects of bond wires.

The one or more integrated circuit dice 510 may be an unpackaged semiconductor die, such as a silicon or compound semiconductor (e.g., Gallium Arsenide (GaAs)) die. The one or more integrated circuit dice 510 may be a packaged die, such as may include one or more packages otherwise supporting or encapsulating a semiconductor die, such as a silicon or GaAs die.

The substrate 400 may include an aperture 520 between the interior volume formed by the conductive cap cavity 412 and a volume external to the interior volume, such as a volume exterior to the electronic device package 100. The aperture 520 may allow for pressure equalization between the interior volume and the exterior volume. Pressure equalization may protect the electronic device package 100 from physical damage due to a pressure difference between the interior volume and the exterior volume, such as may include a pressure difference caused by one or more of temperature, elevation, or atmospheric conditions. In an example, construction of the electronic device package 100 may include the use of heat (e.g. soldering), which may result in the electronic device package 100 being damaged, such as may be due to one or more of a temperature-caused or vapor-caused pressure differential between the interior and exterior volume without an aperture 520.

Figure 6A:
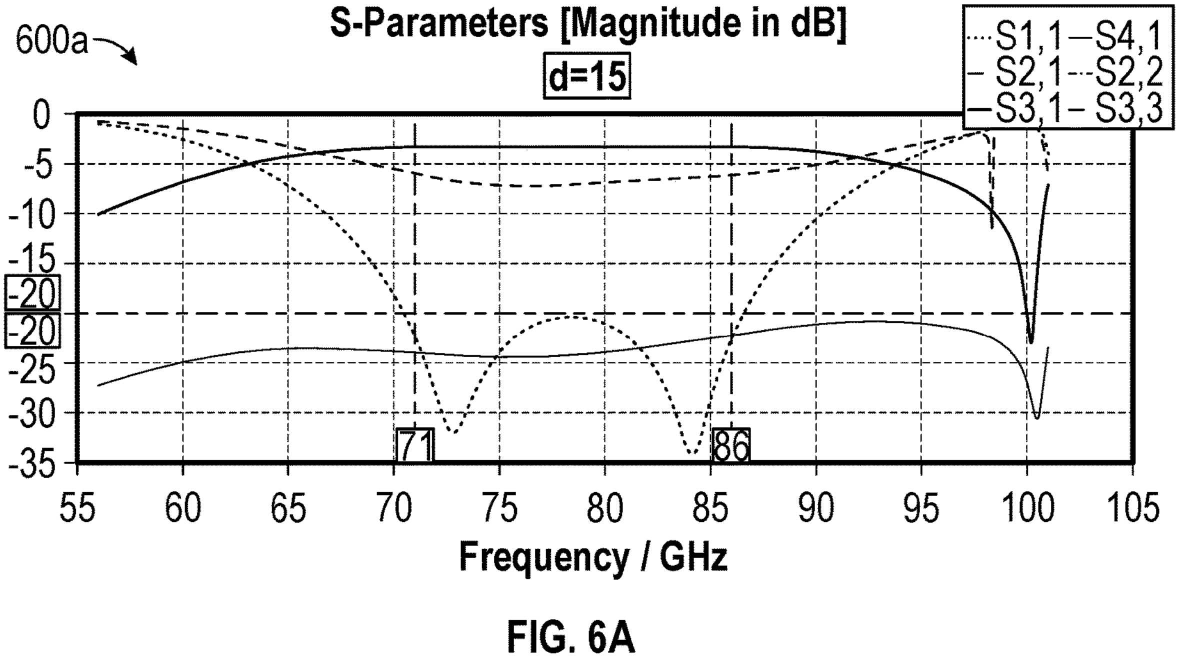
FIG. 6A and FIG. 6B are graphs showing simulated data of S-parameters for an example of a portion of an electronic device package.
Figure 6B:
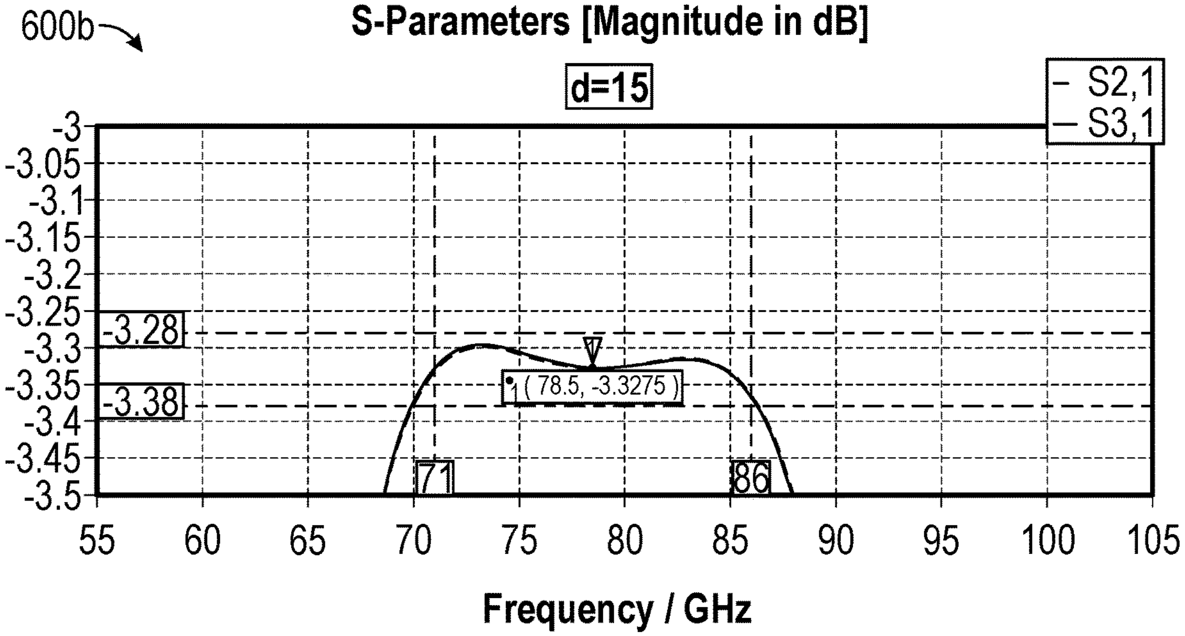

FIG. 6A and FIG. 6B are graphs showing simulated data of scattering parameters (e.g., S-parameters) for an example of a portion of a waveguide. FIG. 6A and FIG. 6B show three-dimensional electromagnetic simulations for the transition cavity including the waveguide connection as port 1, the first antenna 140 as port 2, the second antenna 150 as port 3, and the electromagnetic probe 160 as port 4. FIG. 6A shows graph 600*a* including return losses for each port (S1,1 for the waveguide, S2,2 for the first antenna 140, and S3,3 for the second antenna 150). FIG. 6A also shows insertion losses for the waveguide to antenna transitions (S2,1 for the waveguide to first antenna 140 transition and S3,1 for the waveguide to second antenna 150 transition). FIG. 6A also shows the electromagnetic probe coupling to the waveguide connection of the transition cavity (S4,1). As shown in FIG.

6A, S4,1 may be relatively consistent over a range of frequencies, such as may include from 71 gigahertz to 86 gigahertz. This may help provide an accurate measurement of electromagnetic phenomena in the transition cavity 130.

FIG. 6B shows graph 600*b* corresponding to S2, 1 and S3,1 of FIG. 6A on a finer vertical axis scale. As shown in FIG. 6B, S2,1 and S3,1 may be one or more of very similar or nearly identical. S2,1 and S3,1 may be one or more of generally constant or constant within a specified degree of variation of a given frequency range, such as may include from 71 gigahertz to 86 gigahertz.

Figure 7:
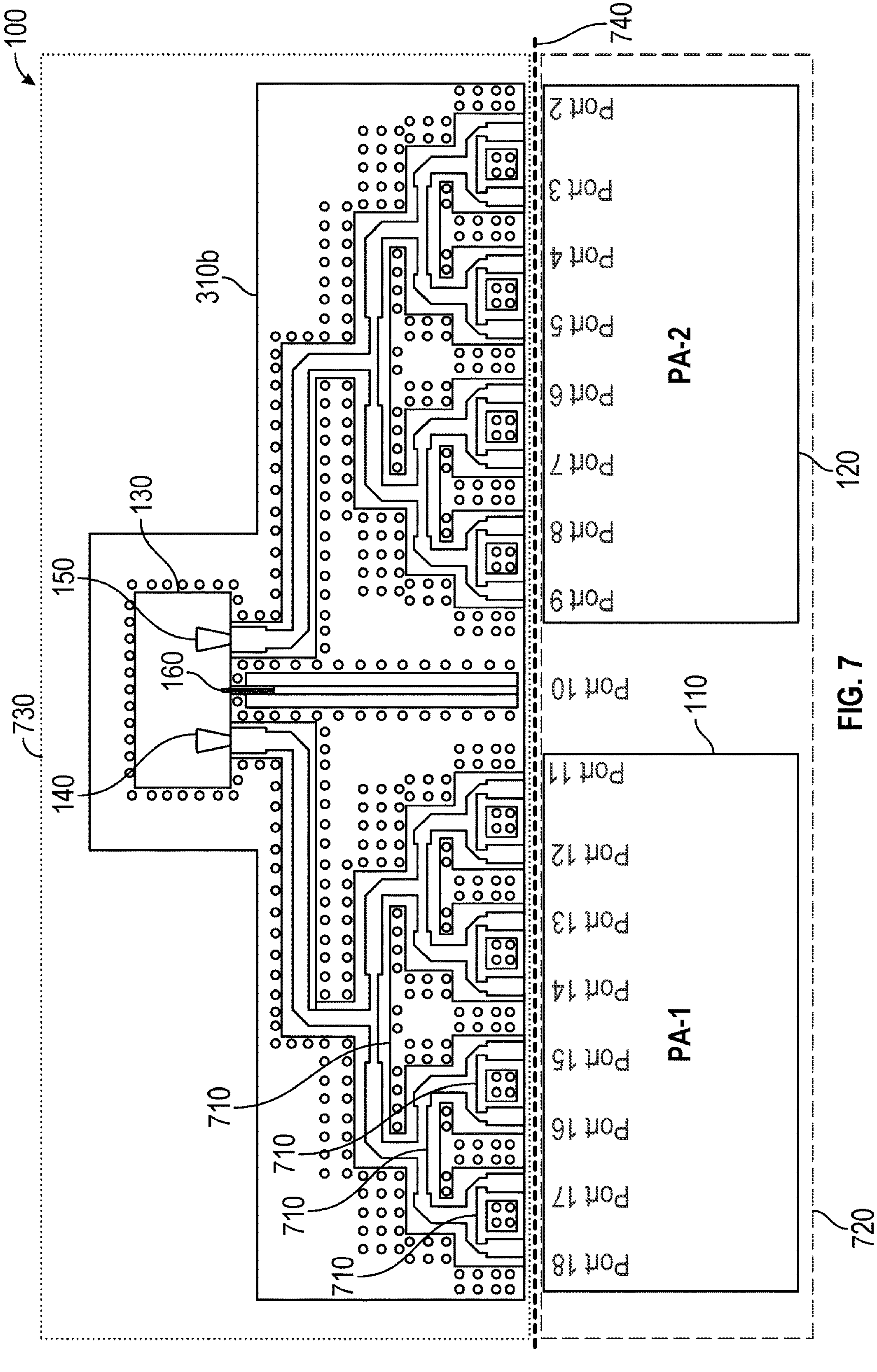
FIG. 7 is a drawing showing an example of a portion of an electronic device package.

FIG. 7 is a drawing showing an example of a portion of an electronic device package 100. In the example of FIG. 7, the electronic device package 100 and an integrated circuit die 720, and a substrate 730. The integrated circuit die 720 may be one of the one or more integrated circuit dice 510, or may be a separate integrated circuit die. The substrate 730 may be the substrate 400, or may be a separate substrate.

The integrated circuit die 720 may include a first power amplifier 110, and a second power amplifier 120. The first power amplifier 110 and the second power amplifier 120 may each have multiple channels coupled to multiple output ports, such as may include 8 channels each. The first power amplifier 110 and second power amplifier 120 contained on the integrated circuit die 720 may need to be coupled to a transmission line in the substrate 730 for signal transmission using the first antenna 140 and the second antenna 150. To couple to a transmission line, a pin or solder bump on the integrated circuit die 720 may connect with the substrate 730. The connection between the integrated circuit die 720 and the substrate 730 may occur at the integrated circuit die-to-substrate junction 740.

The transmission line in the substrate 730 may be a microstrip transmission line, whose signal conductor may be on the top surface of the substrate 730 with a return structure, such as a ground plane, positioned below the conductor. In another example, the transmission line in the substrate 730 may be a stripline transmission line, whose signal conductor may be buried between dielectric layers of the 730 with a return structure, such as may include ground planes, positioned above and below the conductor. In an example, the conductors and return structure of the transmission line may be planar, such as may include being generally flat with a specified thickness.

The coupling between the integrated circuit die 720 and the transmission line may need to travel at least partially vertically, such as may include linking a contact on the integrated circuit die 720 to the transmission line conductor on the surface of the substrate 730 or buried between dielectric layers of the substrate 730. This vertical connection may be susceptible to noise and cross-talk, such as may include noise and crosstalk from another power amplifier channel. The noise and cross-talk due to the vertical connection may be more prevalent than noise and cross-talk due to the transmission lines being on the same conductive substrate layer, such as may be due to a lack of shielding between the vertical links.

The substrate 730 may include a number of planar power combiners 710 to combine output signals associated with the multiple output ports. A planar power combiner 710 may be configured to combine the power from two incoming transmission lines into a single outgoing transmission line. The channels from the first power amplifier 110 may be combined into a single line feeding the first antenna 140 using planar power combiners 710 on the substrate 730. The channels from the second power amplifier 120 may be combined into a single line feeding the second antenna 150 using planar power combiners 710 on the substrate 730. In an example, a portion or all of the planar power combiners may be on the integrated circuit die 720.

Figure 8A:
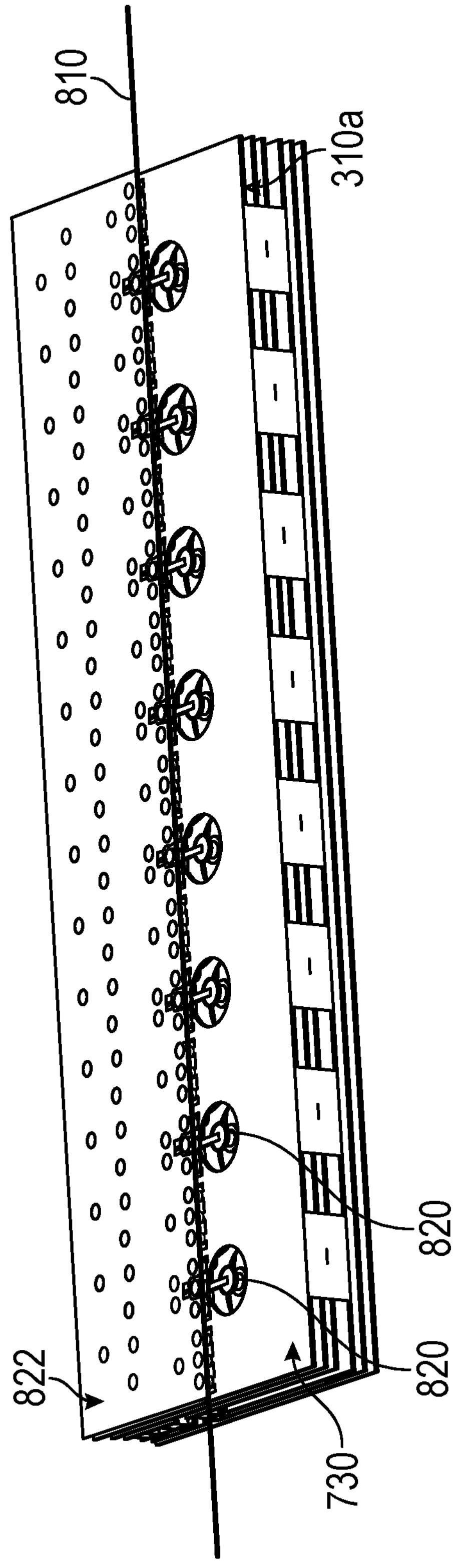
FIG. 8A and FIG. 8B are drawings showing an example of a portion of an electronic device package.
Figure 8B:
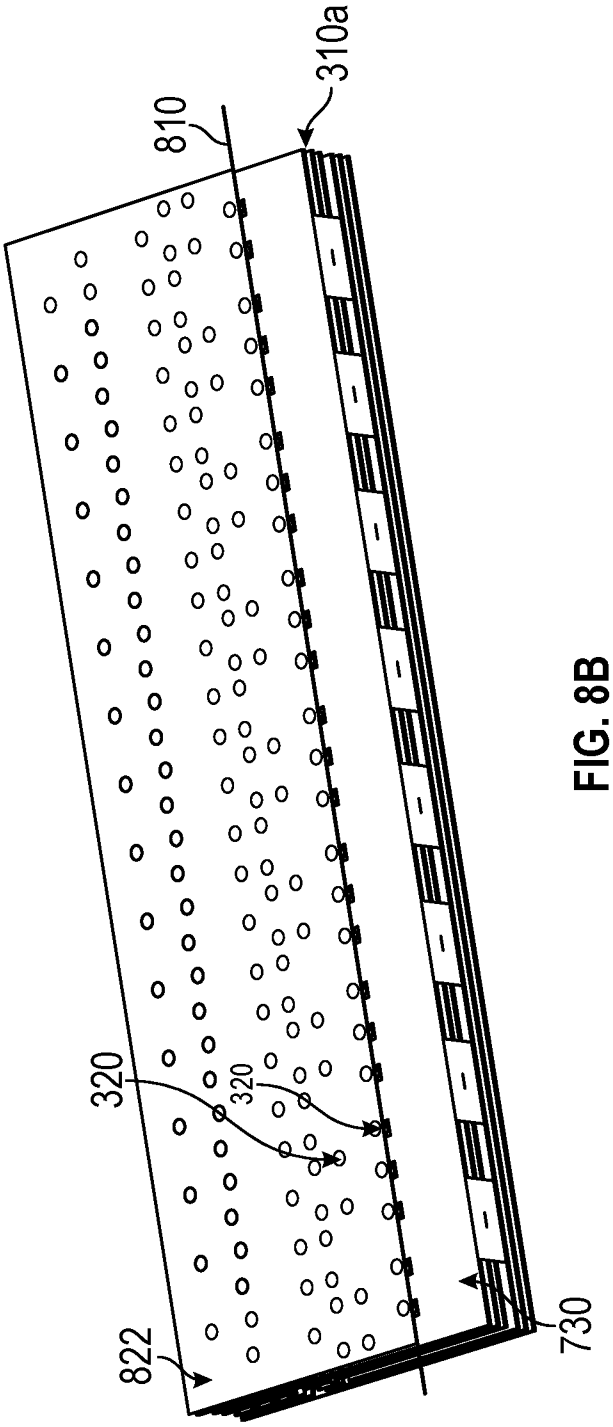

FIG. 8A and FIG. 8B are drawings showing an example of a portion of an electronic device package 100 including a substrate 730 and an integrated circuit die 720 ground plane 822.

The integrated circuit die 720 ground plane 822 may be a bottom layer of the integrated circuit die 720 such as may include one or more of a bottom metallic layer, or a bottom semiconductor layer doped to be conductive. The bottom conductive layer may shield portions of one or more of the integrated circuit die 720 or the substrate 730 from noise or cross-talk between circuits. The integrated circuit die 720 ground plane 822 may include a ground plane edge 810 defined by an edge of the integrated circuit die 720 ground plane 822.

In the example of FIG. 8A, the ground plane edge 810 may not extend to cover the integrated circuit to transmission line transitions 820, such as may include an at least partially vertical link between the integrated circuit die 720 and a transmission line in the substrate 730. The exposed portions of the integrated circuit to transmission line transitions 820 may one or more of radiate electromagnetic waves, resulting in inefficiency, or couple and cross-talk with neighboring integrated circuit to transmission line transitions 820. This may be undesirable.

In the example of FIG. 8B, the integrated circuit die 720 ground plane 822 has been extended such that the ground plane edge 810 may extend beyond the integrated circuit to transmission line transitions 820. This may help to one or more of limit or reduce coupling and cross-talk between neighboring channels. Filled vias 320 may be inserted connecting the ground plane 822 to the top layer of the substrate 730. These filled vias may act to shield neighboring channels. Filled vias 320 may also connect one or more conductive layers in the substrate for further shielding.

Figure 9A:
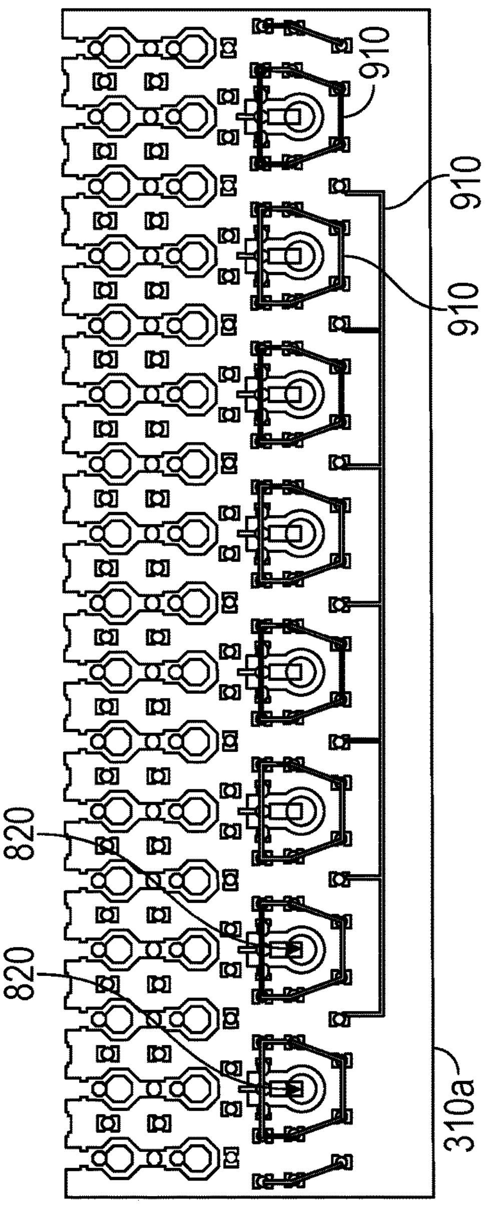
FIG. 9A and FIG. 9B are drawings showing an example of portions of an electronic device package.
Figure 9B:
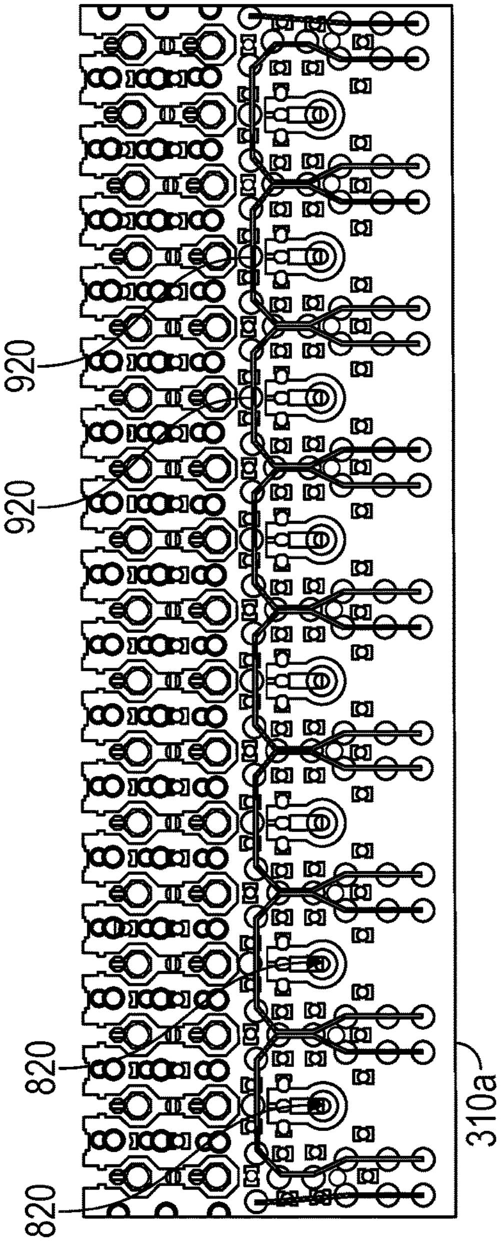

FIG. 9A and FIG. 9B are drawings showing an example of portions of an electronic device package 100, such as may include the electronic device package 100 of FIG. 8B. FIG. 9A may include a top view of portions of the first layer 310*a* and portions of the integrated circuit die 720 ground plane 822. FIG. 9B may include a bottom view of portions of the first layer 310*a*.

In the example of FIG. 9A, there are a number of isolation walls 910 above the first layer 310*a*. These isolation walls may act to one or more of suppress, limit, or reduce coupling, such as may include a mutual inductance, between neighboring integrated circuit to transmission line transitions 820. The isolation walls 910 may be made up of a conductive material, such as may include a metal. The isolation walls 910 may be solid or nearly solid, or they may be composed of isolation vias 920. The isolation walls 910 may extend partially or completely from the first layer 310*a* to the integrated circuit die 720 ground plane 822. The isolation walls 910 may electrically connect the first layer 310*a* to the integrated circuit die 720 ground plane 822.

In the example of FIG. 9B, there are a number of isolation vias 920. The isolation vias 920 may extend from the first layer 310*a* down through the substrate 730 through one or more layers. The isolation vias 920 may electrically connect the first layer 310*a* to one or more other conductive layers of the substrate 730. The isolation vias 920 may help to reduce or limit coupling between neighboring integrated circuit to transmission line transitions 820.

Figure 10:
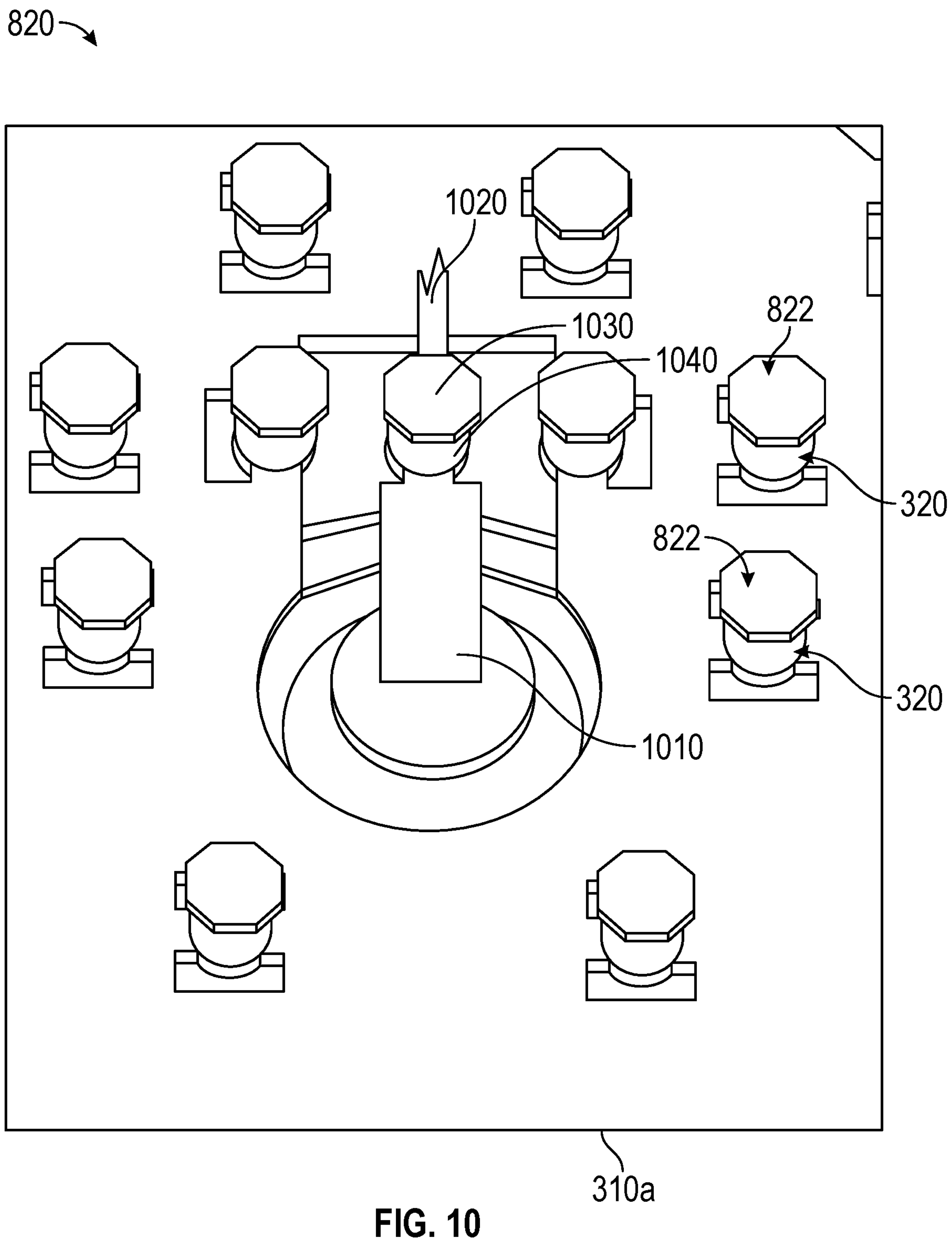
FIG. 10 is a drawing showing an example of portions of an electronic device package.

FIG. 10 is drawing showing an example of portions of an electronic device package 100. FIG. 10 shows one integrated circuit to transmission line transition 820 of FIG. 9B with the extended integrated circuit die 720 ground plane 822 cut away to show the first layer 310*a*. In the example of FIG. 10, the integrated circuit to transmission line transition 820 includes an integrated circuit die trace 1020, an integrated circuit die contact 1030, and a connecting via 1010. The integrated circuit die trace 1020 may be internal to the integrated circuit die 720. The integrated circuit die trace 1020 may be the output of a power amplifier, such as may include a single output channel from a multi-channel power amplifier. The integrated circuit die trace 1020 may be electrically connected to the integrated circuit die contact 1030. A solder bump 1040, such as may exist on a flip-chip integrated circuit, may electrically connect the integrated circuit die contact 1030 to the connecting via 1010.

The connecting via 1010 may be electrically isolated from one or more of the integrated circuit die 720 ground plane 822 or the first layer 310*a*. The connecting via 1010 may be routed generally vertically through one or more layers of the substrate 730. The connecting via 1010 may electrically connect to a transmission line conductor, such as may include a signal conductor in a planar transmission line.

The integrated circuit to transmission line transition 820 may be partially or completely shielded by one or more of the integrated circuit die 720 ground plane 822, the filled vias 320, or one or more of the conductive layers of the substrate 730.

Figure 11:
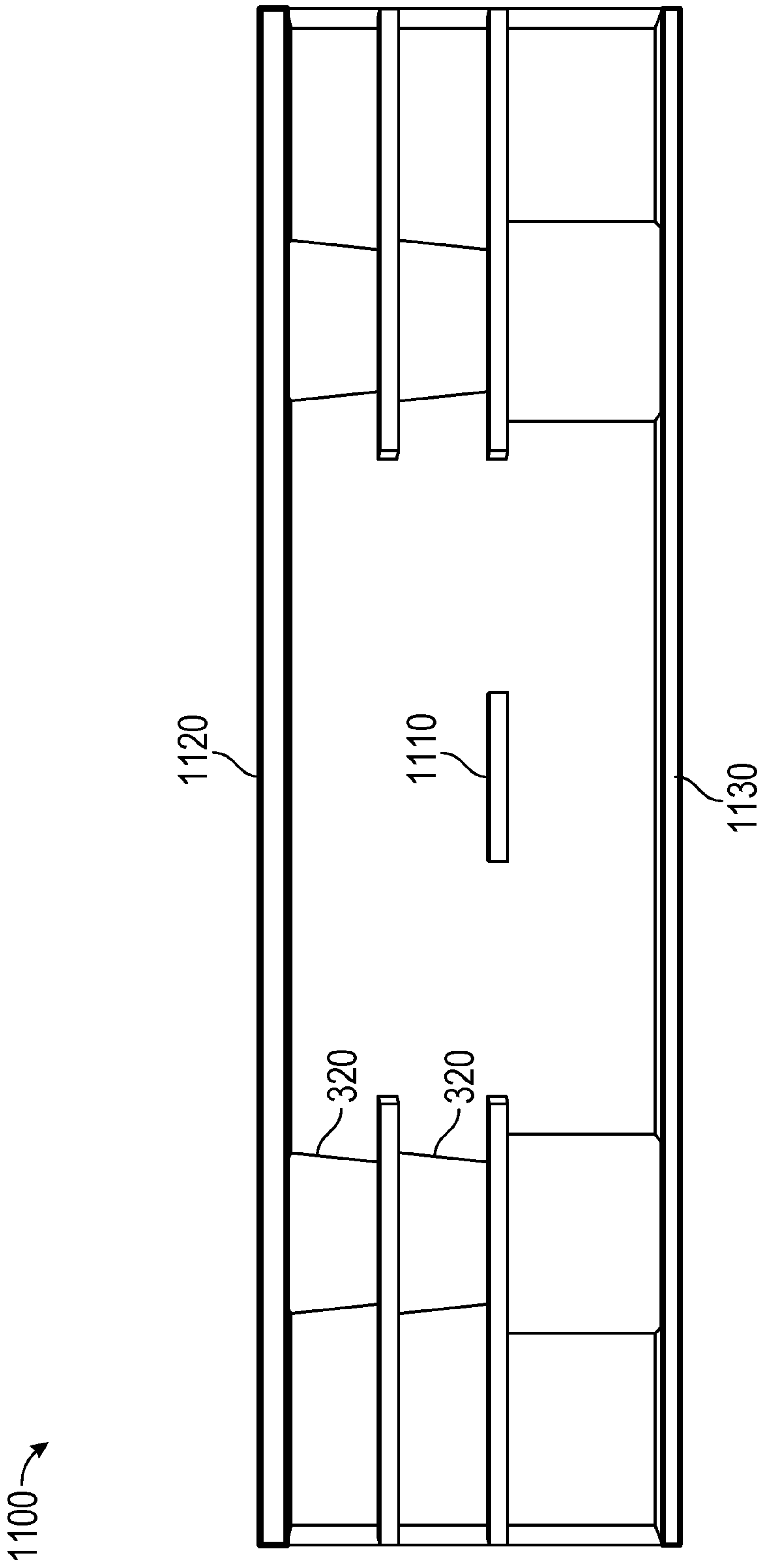
FIG. 11 is a cross-sectional drawing showing an example of a portion of a planar transmission line, such as may be included in an electronic device package.

FIG. 11 is a cross-sectional drawing showing an example of a portion of a planar transmission line 1100, such as may be included in an electronic device package 100. In the example of FIG. 11, the planar transmission line 1100 may be a stripline. The planar transmission line 1100 may include a top return plane 1120, a bottom return plane 1130, a first planar conductor 1110, and one or more filled vias 320. The top return plane 1120 and the bottom return plane 1130 may be planar conductive regions adjacent to the first planar conductor 1110.

The first planar conductor 1110 may be connected to a signal source, such as may include using a connecting via 1010. The signal source may provide one or more of a voltage or current signal. One or more of the top return plane 1120, the bottom return plane 1130, or the one or more filled vias 320 may be connected to a reference potential, such as may include a ground potential. In an example, the combination of one or more of the top return plane 1120, the bottom return plane 1130, and the one or more filled vias 320 comprise the return structure for the planar transmission line 1100.

The planar transmission line 1100 may be used to transmit a signal, such as may include a radio-frequency signal. The planar transmission line 1100 may transmit a signal from an integrated circuit die 720 to a antenna, such as may include a first antenna 140 or a second antenna 150. The planar transmission line 1100 may transmit a signal using one or more modes, such as may include electromagnetic wave modes. The 1100 may transmit transverse electromagnetic (TEM) modes, quasi-TEM modes, or non-TEM modes.

Figure 12A:
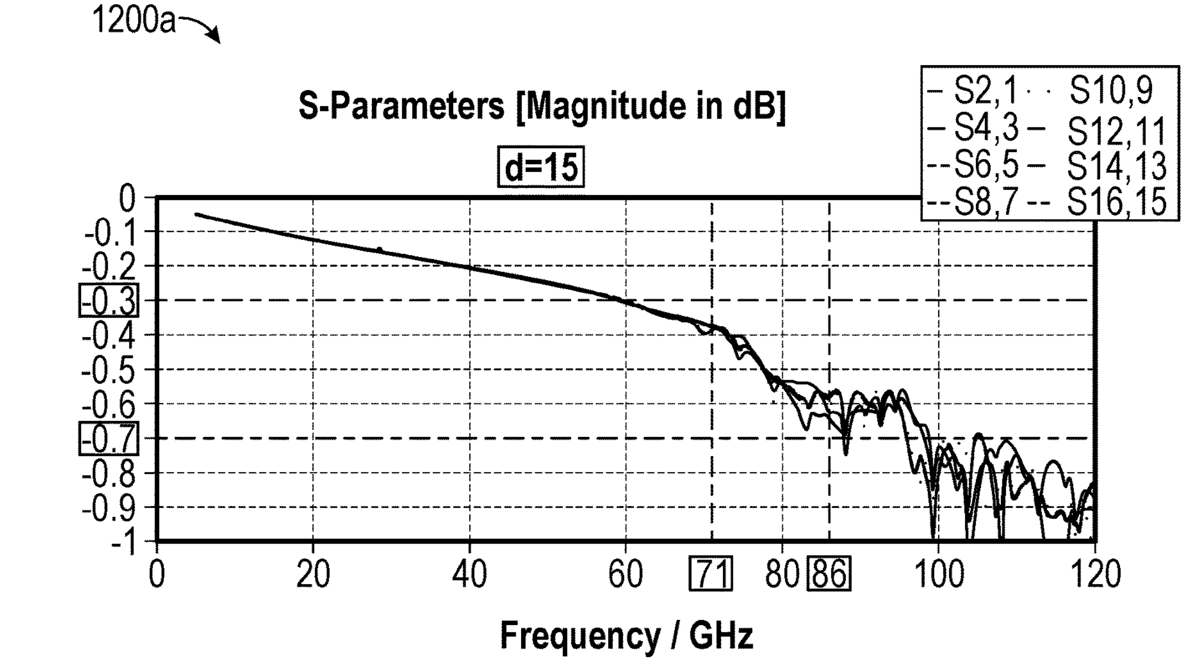
FIG. 12A and FIG. 12B are graphs showing simulated data of S-parameters for an example of a portion of an electronic device package.
Figure 12B:
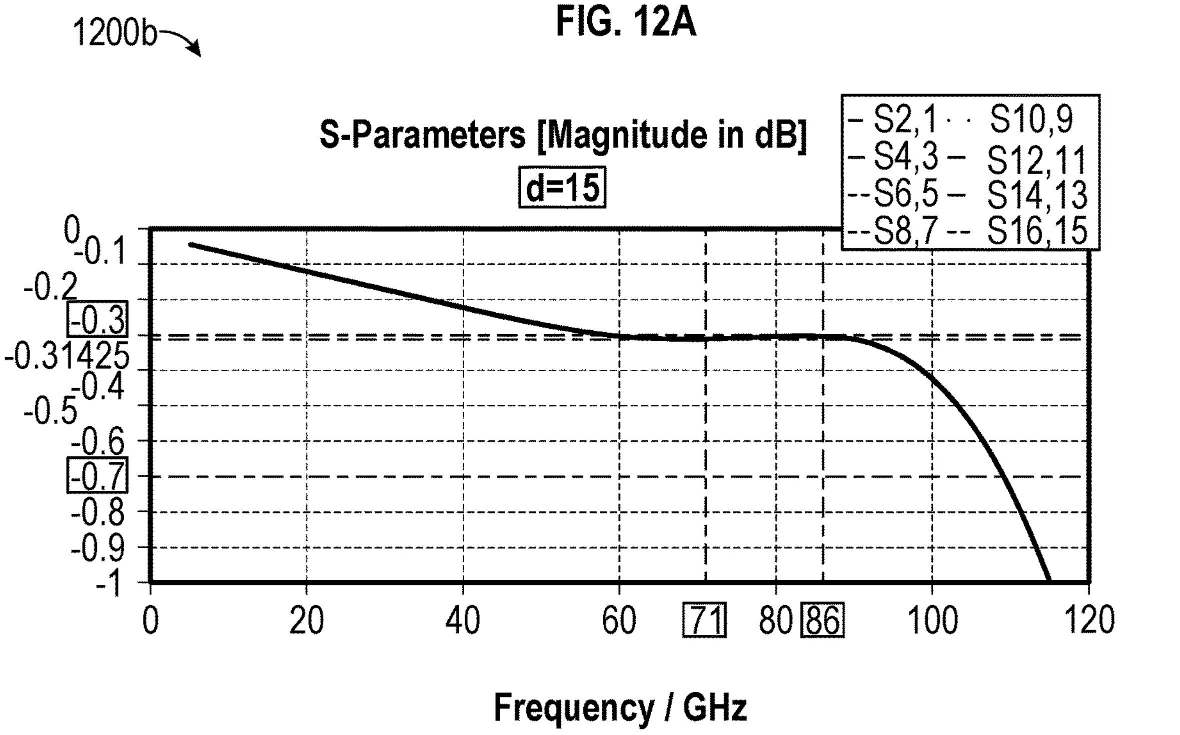

FIG. 12A, FIG. 12B, FIG. 13A, and FIG. 13B are graphs showing experimentally obtained data of S-parameters for an example of a portion of an electronic device package 100. FIG. 12A, FIG. 12B, FIG. 13A, and FIG. 13B show three-dimensional electromagnetic simulations for the transition from 8 ports on a power amplifier to 8 stripline transmission lines respectively. Ports 1, 3, 5, 7, 9, 11, 13, and 15 represent the 8 ports of the power amplifier, respectively. Ports 2, 4, 6, 8, 10, 12, 14, and 16 represent the 8 stripline transmission lines, respectively. FIG. 12A showing graph 1200*a* and FIG. 12B showing graph 1200*b* show the insertion loss for each respective power amplifier channel to stripline transition (e.g. S2,1, S4,3, S6,5).

FIG. 12A shows simulated data for the power amplifier to stripline transitions of FIG. 8A without an extended ground plane edge 810. The ripples in FIG. 12A may be due to coupling between one or more adjacent power amplifier to stripline transitions. FIG. 12B shows simulated data for the power amplifier to stripline transitions of FIG. 8B with an extended ground plane edge 810. The response shown in FIG. 12B is smoother than the response shown in FIG. 12A, and the response among all channels is similar. This response may be due to the shielding between adjacent channels from one or more of the extended integrated circuit die 720 ground plane 822 or the shielding vias 320. FIG. 12B shows that the insertion loss for each channel is substantially consistent for the range of 71 gigahertz to 86 gigahertz. In FIG. 12A, there are numerous overlapping lines. In FIG. 12B, the response is substantially identical for all channels resulting in all of the graph lines nearly overlapping.

Figure 13A:
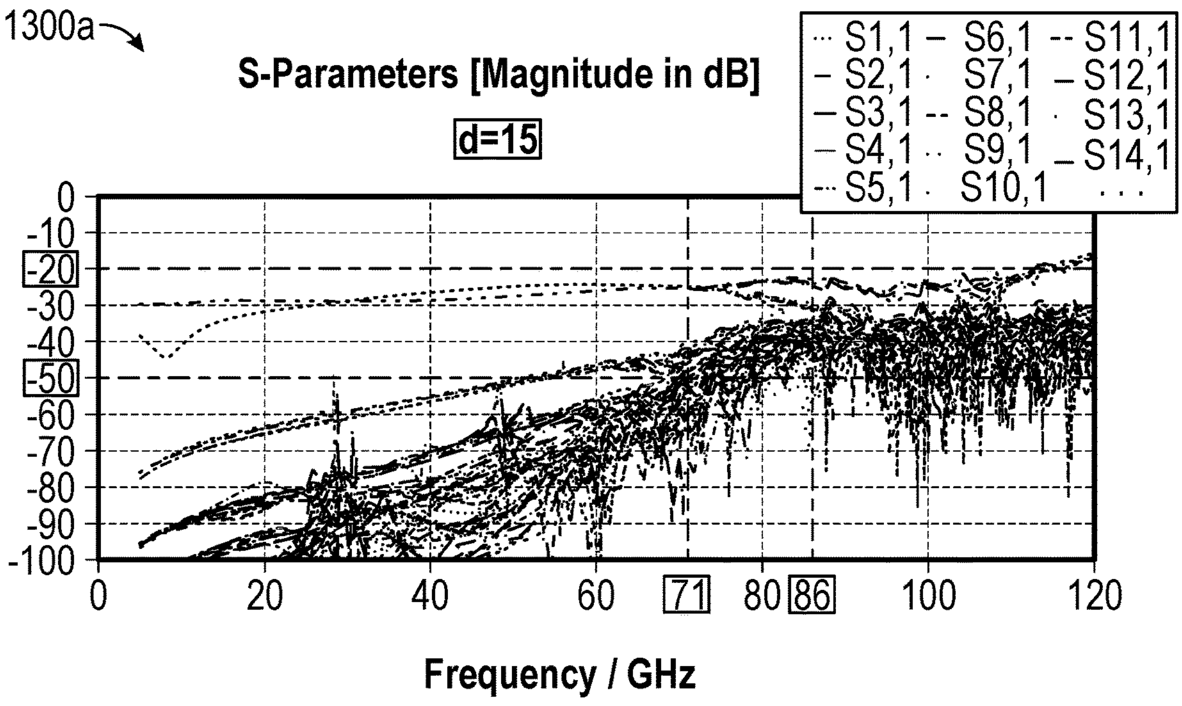
FIG. 13A and FIG. 13B are graphs showing simulated data of S-parameters for an example of a portion of an electronic device package.
Figure 13B:
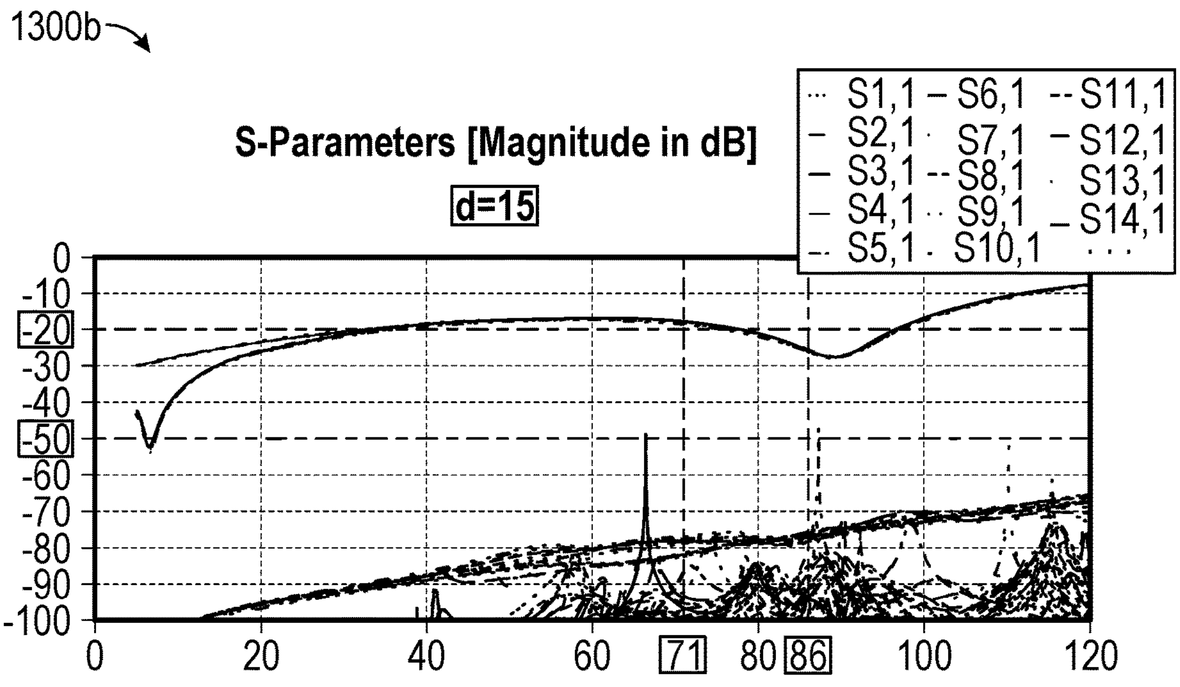

FIG. 13A showing graph 1300*a* and FIG. 13B showing graph 1300*b* show the insertion losses (e.g. S2,1, S4,3), return losses (e.g. S1,1, S2,2), for each of the 8 integrated circuit to stripline transitions. Also shown are the cross-coupling losses between channels (e.g. S3,1, S4,1, S3,2, S3,5, S3,6). Note that not every line is shown in the legend.

FIG. 13A shows simulated data for the power amplifier to stripline transitions of FIG. 8A without an extended ground plane edge 810. The ripples in FIG. 13A show the coupling between adjacent channels of the power amplifier and between adjacent transmission line transitions 820. FIG. 13B shows simulated data for the power amplifier to stripline transitions of FIG. 8B with an extended ground plane edge 810. FIG. 13B shows that the cross-coupling is much lower, such as may be due to the extended ground plane edge 810 and shielding vias 320. For example, the majority of the cross-coupling S parameters are below 50 dB.

FIG. 14 is a flow chart 1400 showing an example of a method of operating an electronic device package 100. At 1402—a first antenna and a second antenna can be driven using a first power amplifier and a second power amplifier respectively, wherein the first antenna and the second antenna are positioned to excite a transition cavity, the transition cavity defined by a dielectric medium, the transition cavity sized and shaped for mechanical coupling with a waveguide structure. At 1404—a signal representative of an electromagnetic field in the transition cavity can be received from an electromagnetic probe electrically coupled with the transition cavity. At 1406—at least one of the first power amplifier or the second power amplifier can be adjusted based at least in part upon the received signal from the electromagnetic probe. The shown order of steps is not intended to be a limitation on the order the steps are performed in. In an example, two or more steps may be performed simultaneously or at least partially concurrently.

The driving of the first antenna and the second antenna in 1402 may include driving with a signal for transmission into a waveguide. The adjustment in step 1406 may include one or more of a power, amplitude, or phase adjustment. The adjustment in step 1406 may help one or more of the overall power or efficiency of the electronic device package 100, such as may be due to better planar power combining or better electromagnetic field combination.

The systems, techniques, and methods described herein are believed to apply, at least in part, to a system for receiving electromagnetic signals, such as electromagnetic signal in a waveguide, as well as to a system for transmitting electromagnetic signals.

EXAMPLES

Example 1 is an electronic device package, comprising: a substrate comprising a dielectric medium; a transition cavity defined by the dielectric medium, the transition cavity sized and shaped for mechanical coupling with a waveguide structure; a first antenna and a second antenna, the first antenna and the second antenna positioned to excite the transition cavity, the first antenna fed by a first transmission line and the second antenna fed by a second transmission line; and an electromagnetic probe electrically coupled with the transition cavity; wherein the electromagnetic probe interacts with an electromagnetic field in the transition cavity and provides an electrical signal representative of the electromagnetic field in the transition cavity; wherein the first transmission line comprises a first planar conductor and the second transmission line comprises a second planar conductor, the first planar conductor and the second planar conductor supported by at least one dielectric layer defining the dielectric medium.

In Example 2, the subject matter of Example 1 includes, wherein the first planar conductor and the second planar conductor are buried within the dielectric medium between respective dielectric layers defining the dielectric medium.

In Example 3, the subject matter of Examples 1-2 includes, wherein the first transmission line comprises a first stripline structure defined by the first planar conductor and a first return structure; and wherein the second transmission line comprises a second stripline structure defined by the second planar conductor and a second return structure.

In Example 4, the subject matter of Example 3 includes, wherein the first return structure and the second return structure comprise planar conductive regions adjacent to the first planar conductor and the second planar conductor, respectively.

In Example 5, the subject matter of Example 4 includes, wherein the planar conductive regions are buried within the dielectric medium.

In Example 6, the subject matter of Examples 1-5 includes, wherein the electromagnetic probe is buried within the dielectric medium between respective dielectric layers defining the dielectric medium.

In Example 7, the subject matter of Examples 1-6 includes, wherein the first antenna and the second antenna are buried within the dielectric medium between respective dielectric layers defining the dielectric medium.

In Example 8, the subject matter of Examples 1-7 includes, a conductive cap located on a surface of the dielectric medium overlapping with the transition cavity opposite a surface of the dielectric medium defining an output of the transition cavity used for mechanical coupling with a waveguide structure.

In Example 9, the subject matter of Example 8 includes, wherein the conductive cap defines an interior volume; and wherein dielectric medium defines an aperture allowing pressure equalization between the interior volume and another volume external to the interior volume.

In Example 10, the subject matter of Examples 1-9 includes, wherein the first antenna and the second antenna are arranged on one side of the transition cavity.

In Example 11, the subject matter of Examples 1-10 includes, wherein the first antenna and the first transmission line are fed by a first power amplifier and the second antenna and the second transmission line are fed by a second power amplifier.

In Example 12, the subject matter of Example 11 includes, wherein the first power amplifier and the second power amplifier respectively include multiple output ports, and wherein respective output signals associated with the multiple output ports are combined using respective planar power combiners, and using spatial combination of the fields established by the first antenna and the second antenna in the transition cavity.

In Example 13, the subject matter of Examples 11-12 includes, wherein an output of the first antenna comprises a specified phase relationship with respect to an output of the second antenna to establish constructive spatial summation of the fields established by the first antenna and the second antenna in the transition cavity.

In Example 14, the subject matter of Examples 1-13 includes, wherein the first planar conductor and the second planar conductor comprise rolled copper.

In Example 15, the subject matter of Examples 1-14 includes, wherein the first antenna and the second antenna operate at a frequency between 71 gigahertz and 86 gigahertz.

Example 16 is a method of operating an electronic device package, the method comprising: driving a first antenna and a second antenna using a first power amplifier and a second power amplifier respectively, wherein the first antenna and the second antenna are positioned to excite a transition cavity, the transition cavity defined by a dielectric medium, the transition cavity sized and shaped for mechanical coupling with a waveguide structure; receiving, from an electromagnetic probe electrically coupled with the transition cavity, a signal representative of an electromagnetic field in the transition cavity; and adjusting, based at least in part upon the received signal from the electromagnetic probe, at least one of the first power amplifier or the second power amplifier.

In Example 17, the subject matter of Example 16 includes, wherein the first power amplifier and the second power amplifier each have two or more channels, wherein the two or more channels of the first power amplifier are combined using planar power combiners before driving the first antenna, and wherein the two or more channels of the second power amplifier are combined using planar power combiners before driving the second antenna.

In Example 18, the subject matter of Example 17 includes, wherein the two or more channels of the first power combiner are independently operable, wherein the two or more channels of the second power combiner are independently operable.

In Example 19, the subject matter of Example 18 includes, tuning one or more channels of the first power amplifier or the second power amplifier by operating a single channel at a time and using the signal representative of the electromagnetic field in the transition cavity to adjust one or more parameters of the channel being tuned.

Example 20 is an electronic device package, comprising: a substrate comprising a dielectric medium; a transition cavity defined by the dielectric medium, the transition cavity sized and shaped for mechanical coupling with a waveguide structure; a first antenna and a second antenna, the first antenna and the second antenna positioned to excite the transition cavity, the first antenna fed by a first transmission line and the second antenna fed by a second transmission line; an electromagnetic probe electrically coupled with the transition cavity; wherein the electromagnetic probe interacts with an electromagnetic field in the transition cavity and provides an electrical signal representative of the electromagnetic field in the transition cavity; and a conductive cap located on a surface of the dielectric medium overlapping with the transition cavity opposite a surface of the dielectric medium defining an output of the transition cavity used for mechanical coupling with a waveguide structure.

Example 21 is an electronic device package, comprising: an integrated circuit die mounted on a package substrate, the package substrate comprising a dielectric medium, the integrated circuit die comprising respective electrical interconnects located between the integrated circuit die and the dielectric medium; a first transmission line embedded within the dielectric medium, the first transmission line fed by the integrated circuit die from at least one of the respective electrical interconnects and through a corresponding first via structure in the dielectric medium; a waveguide transition cavity defined by the dielectric medium, the waveguide transition cavity excited by a first antenna fed by the first transmission line; and a conductive cap located on a surface of the dielectric medium overlapping with the waveguide transition cavity opposite a surface of the dielectric medium defining an output of the waveguide transition cavity used for mechanical coupling with a waveguide structure.

In Example 22, the subject matter of Example 21 includes, wherein the conductive cap defines an interior volume; and wherein the dielectric medium defines an aperture allowing pressure equalization between the interior volume and another volume external to the interior volume.

In Example 23, the subject matter of Examples 21-22 includes, wherein the integrated circuit die is oriented in a flip-chip configuration where the respective electrical interconnects are aligned with input or output pads of the integrated circuit die.

In Example 24, the subject matter of Example 23 includes, wherein the respective electrical interconnects comprise respective bumps or pillars.

In Example 25, the subject matter of Examples 21-24 includes, wherein the integrated circuit die comprises or is attached to a conductive plane that extends to overlap with a location of the first via structure in the dielectric medium.

In Example 26, the subject matter of Example 25 includes, wherein the conductive plane is connected to a first return structure of the first transmission line by one or more conductive pillars.

In Example 27, the subject matter of Example 26 includes, wherein the one or more conductive pillars are arranged around a perimeter of the first via structure.

In Example 28, the subject matter of Examples 25-27 includes, a second transmission line embedded within the dielectric medium, the second transmission line fed by the integrated circuit die from at least one of the respective electrical interconnects and through a corresponding second via structure in the dielectric medium, wherein the conductive plane is connected to one or more conductive pillars, arranged around a perimeter of one or more of the first via structure and the second via structure, and configured to one or more of suppress or limit a mutual induction between the first via structure and second via structure.

In Example 29, the subject matter of Example 28 includes, wherein the waveguide transition cavity is excited by a second antenna fed by the second transmission line.

In Example 30, the subject matter of Examples 28-29 includes, wherein the first transmission line and the second transmission line are combined using a planar power combiner.

In Example 31, the subject matter of Examples 21-30 includes, wherein the first transmission line comprises a first planar conductor.

In Example 32, the subject matter of Example 31 includes, wherein the first planar conductor is buried within the dielectric medium between respective dielectric layers defining the dielectric medium.

In Example 33, the subject matter of Examples 21-32 includes, wherein the first transmission line comprises a first stripline structure defined by a first planar conductor and a first return structure.

In Example 34, the subject matter of Example 33 includes, wherein the first return structure comprises a first planar conductive region adjacent to the first planar conductor.

In Example 35, the subject matter of Example 34 includes, wherein the first planar conductive region is buried within the dielectric medium.

In Example 36, the subject matter of Examples 21-35 includes, an electromagnetic probe electrically coupled with the waveguide transition cavity, wherein the electromagnetic probe interacts with an electromagnetic field in the waveguide transition cavity and provides an electrical signal representative of an electromagnetic field in the waveguide transition cavity.

In Example 37, the subject matter of Example 36 includes, wherein the electromagnetic probe is buried within the dielectric medium between respective dielectric layers defining the dielectric medium.

Example 38 is an electronic device package, comprising: an integrated circuit die mounted on a package substrate, the package substrate comprising a dielectric medium, the integrated circuit die comprising respective electrical interconnects located between the integrated circuit die and the dielectric medium; and a first transmission line embedded within the dielectric medium, the first transmission line fed by the integrated circuit die from at least one of the respective electrical interconnects and through a corresponding first via structure in the dielectric medium; wherein the integrated circuit die comprises or is attached to a conductive plane that extends to overlap with a location of the first via structure in the dielectric medium; wherein the conductive plane is connected to a first return structure of the first transmission line by one or more conductive pillars.

In Example 39, the subject matter of Example 38 includes, wherein the one or more conductive pillars are arranged around a perimeter of the first via structure.

In Example 40, the subject matter of Examples 38-39 includes, wherein the integrated circuit die is oriented in a flip-chip configuration where the respective electrical interconnects are aligned with input or output pads of the integrated circuit die.

Example 41 is at least one machine-readable medium including instructions that, when executed by processing circuitry, cause the processing circuitry to perform operations to implement of any of Examples 1-40.

Example 42 is an apparatus comprising means to implement of any of Examples 1-40.

Example 43 is a system to implement of any of Examples 1-40.

Example 44 is a method to implement of any of Examples 1-40.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic device package, comprising:

an integrated circuit die mounted on a package substrate, the package substrate comprising a dielectric medium, the integrated circuit die comprising respective electrical interconnects located between the integrated circuit die and the dielectric medium;

a first transmission line embedded within the dielectric medium, the first transmission line fed by the integrated circuit die from at least one of the respective electrical interconnects and through a corresponding first via structure in the dielectric medium;

a waveguide transition cavity defined by the dielectric medium, the waveguide transition cavity excited by a first antenna fed by the first transmission line; and a conductive cap located on a surface of the dielectric medium overlapping with the waveguide transition cavity opposite a surface of the dielectric medium defining an output of the waveguide transition cavity used for mechanical coupling with a waveguide structure.

2. The electronic device package of claim 1, wherein the conductive cap defines an interior volume; and wherein the dielectric medium defines an aperture allowing pressure equalization between the interior volume and another volume external to the interior volume.

3. The electronic device package of claim 1, wherein the integrated circuit die is oriented in a flip-chip configuration where the respective electrical interconnects are aligned with input or output pads of the integrated circuit die.

4. The electronic device package of claim 3, wherein the respective electrical interconnects comprise respective bumps or pillars.

5. The electronic device package of claim 1, wherein the integrated circuit die comprises or is attached to a conductive plane that extends to overlap with a location of the first via structure in the dielectric medium.

6. The electronic device package of claim 5, wherein the conductive plane is connected to a first return structure of the first transmission line by one or more conductive pillars.

7. The electronic device package of claim 6, wherein the one or more conductive pillars are arranged around a perimeter of the first via structure.

8. The electronic device package of claim 5, comprising a second transmission line embedded within the dielectric medium, the second transmission line fed by the integrated circuit die from at least one of the respective electrical interconnects and through a corresponding second via structure in the dielectric medium, wherein the conductive plane is connected to one or more conductive pillars, arranged around a perimeter of one or more of the first via structure and the second via structure, and configured to one or more of suppress or limit a mutual induction between the first via structure and second via structure.

9. The electronic device package of claim 8, wherein the waveguide transition cavity is excited by a second antenna fed by the second transmission line.

10. The electronic device package of claim 8, wherein the first transmission line and the second transmission line are combined using a planar power combiner.

11. The electronic device package of claim 1, wherein the first transmission line comprises a first planar conductor.

12. The electronic device package of claim 11, wherein the first planar conductor is buried within the dielectric medium between respective dielectric layers defining the dielectric medium.

13. The electronic device package of claim 1, wherein the first transmission line comprises a first stripline structure defined by a first planar conductor and a first return structure.

14. The electronic device package of claim 13, wherein the first return structure comprises a first planar conductive region adjacent to the first planar conductor.

15. The electronic device package of claim 14, wherein the first planar conductive region is buried within the dielectric medium.

16. The electronic device package of claim 1, further comprising an electromagnetic probe electrically coupled with the waveguide transition cavity, wherein the electromagnetic probe interacts with an electromagnetic field in the waveguide transition cavity and provides an electrical signal representative of an electromagnetic field in the waveguide transition cavity.

17. The electronic device package of claim 16, wherein the electromagnetic probe is buried within the dielectric medium between respective dielectric layers defining the dielectric medium.

18. An electronic device package, comprising:

an integrated circuit die mounted on a package substrate, the package substrate comprising a dielectric medium, the integrated circuit die comprising respective electrical interconnects located between the integrated circuit die and the dielectric medium; and a first transmission line embedded within the dielectric medium, the first transmission line fed by the integrated circuit die from at least one of the respective electrical interconnects and through a corresponding first via structure in the dielectric medium;

wherein the integrated circuit die comprises or is attached to a conductive plane that extends to overlap with a location of the first via structure in the dielectric medium;

wherein the conductive plane is connected to a first return structure of the first transmission line by one or more conductive pillars.

19. The electronic device package of claim 18, wherein the one or more conductive pillars are arranged around a perimeter of the first via structure.

20. The electronic device package of claim 18, wherein the integrated circuit die is oriented in a flip-chip configuration where the respective electrical interconnects are aligned with input or output pads of the integrated circuit die.

* * * * *